US009742250B2

United States Patent
Kremerman

(10) Patent No.: US 9,742,250 B2
(45) Date of Patent: Aug. 22, 2017

(54) MOTOR MODULES, MULTI-AXIS MOTOR DRIVE ASSEMBLIES, MULTI-AXIS ROBOT APPARATUS, AND ELECTRONIC DEVICE MANUFACTURING SYSTEMS AND METHODS

(71) Applicant: Applied Materials, Inc., Santa Clara, CA (US)

(72) Inventor: Izya Kremerman, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 317 days.

(21) Appl. No.: 14/090,929

(22) Filed: Nov. 26, 2013

(65) Prior Publication Data

US 2014/0150592 A1    Jun. 5, 2014

Related U.S. Application Data

(60) Provisional application No. 61/732,196, filed on Nov. 30, 2012.

(51) Int. Cl.
*H02K 16/00* (2006.01)
*H02K 11/00* (2016.01)
(Continued)

(52) U.S. Cl.
CPC ............ *H02K 16/00* (2013.01); *B25J 9/042* (2013.01); *B25J 9/126* (2013.01); *B25J 11/0095* (2013.01);
(Continued)

(58) Field of Classification Search
CPC ........ H02K 16/00; H02K 9/197; H02K 11/00; B25J 17/00; H03K 13/00
(Continued)

(56) References Cited

U.S. PATENT DOCUMENTS 5,046,992 A    9/1991    Tamai et al.
5,314,294 A    5/1994    Taniguchi et al.
(Continued)

FOREIGN PATENT DOCUMENTS

CN    1369948 A    9/2002
CN    102326244 A    1/2012
(Continued)

OTHER PUBLICATIONS

Amendment Submitted with Filing of RCE of U.S. Appl. No. 14/090,899, filed Dec. 30, 2015.
(Continued)

*Primary Examiner* — Kawing Chan
(74) *Attorney, Agent, or Firm* — Dugan & Dugan, PC

(57) ABSTRACT

Motor modules for multi-arm robot apparatus are described. The motor modules can be used individually or stacked and assembled to make up one-axis, 2-axis, 3-axis, 4-axis, 5-axis, 6-axis motor assemblies, or more. One or more of the motor modules have a stator assembly including a stator received in the stator housing, and a rotor assembly abutting the stator assembly, the rotor assembly including a rotor housing, a drive shaft, a bearing assembly supporting the drive shaft, and a rotor coupled to the drive shaft. A vacuum barrier member is positioned between the rotor and the stator. Multi-axis motor drive assemblies, multi-axis robot apparatus, electronic device manufacturing systems, and methods of assembling drive assemblies are described, as are numerous other aspects.

20 Claims, 18 Drawing Sheets

(51) Int. Cl.
*B25J 11/00* (2006.01)
*H01L 21/677* (2006.01)
*B25J 9/04* (2006.01)
*B25J 9/12* (2006.01)
*H02K 5/128* (2006.01)

(52) U.S. Cl.
CPC .. *H01L 21/67703* (2013.01); *H01L 21/67742* (2013.01); *H02K 5/128* (2013.01); *H02K 2213/12* (2013.01); *Y10S 901/23* (2013.01); *Y10T 29/49009* (2015.01); *Y10T 74/20317* (2015.01)

(58) Field of Classification Search
USPC .... 79/490, 479.01, 469; 29/596, 592.1, 592; 310/112, 40 R, 10
See application file for complete search history.

(56) References Cited

U.S. PATENT DOCUMENTS

| | | | |
|---|---|---|---|
| 6,105,454 A | 8/2000 | Bacchi et al. | |
| 6,485,250 B2 | 11/2002 | Hofmeister | |
| 6,543,306 B1 | 4/2003 | WakaBayashi et al. | |
| 6,601,468 B2* | 8/2003 | Grover | B25J 9/042 414/744.5 |
| 6,669,434 B2 | 12/2003 | Namba et al. | |
| 6,737,826 B2 | 5/2004 | Gilchrist | |
| 6,799,939 B2 | 10/2004 | Lowrance et al. | |
| 7,071,593 B2* | 7/2006 | Matsushita | H02K 1/145 310/194 |
| 7,151,333 B2* | 12/2006 | Suzuki | H02K 5/225 310/71 |
| 7,688,017 B2 | 3/2010 | Hudgens | |
| 7,891,935 B2 | 2/2011 | Kremerman | |
| 8,304,955 B2* | 11/2012 | Suzuki | H02K 3/525 310/194 |
| 2003/0180139 A1 | 9/2003 | Lowrance et al. | |
| 2004/0001750 A1 | 1/2004 | Kremerman | |
| 2005/0079042 A1 | 4/2005 | Maeda | |
| 2005/0264113 A1* | 12/2005 | Suzuki | F16K 31/04 310/80 |
| 2005/0264117 A1* | 12/2005 | Hata | H02K 1/28 310/90 |
| 2006/0245905 A1 | 11/2006 | Hudgens | |
| 2007/0046243 A1* | 3/2007 | Hori | F16H 61/32 318/630 |
| 2007/0116549 A1 | 5/2007 | Rice et al. | |
| 2008/0063504 A1 | 3/2008 | Kroetz et al. | |
| 2008/0298945 A1 | 12/2008 | Cox et al. | |
| 2010/0178135 A1 | 7/2010 | Laceky et al. | |
| 2010/0178146 A1 | 7/2010 | Kremerman et al. | |
| 2010/0178147 A1 | 7/2010 | Kremerman et al. | |
| 2011/0309699 A1* | 12/2011 | Woolmer | H02K 1/30 310/58 |
| 2013/0039726 A1 | 2/2013 | Brodine et al. | |
| 2013/0115028 A1 | 5/2013 | Kremerman et al. | |
| 2013/0121798 A1 | 5/2013 | Hosek | |
| 2013/0149076 A1 | 6/2013 | Cox et al. | |
| 2014/0348618 A1* | 11/2014 | Blank | H01L 21/67742 414/217 |

FOREIGN PATENT DOCUMENTS

| | | |
|---|---|---|
| JP | 11-215780 | 8/1999 |
| JP | 2000-069741 | 3/2000 |
| TW | 201233511 A | 8/2012 |
| WO | WO2006088757 | 8/2006 |

OTHER PUBLICATIONS

Advisory Action of U.S. Appl. No. 14/090,899 mailed Dec. 10, 2015.
Notice to File Corrected Application Papers of U.S. Appl. No. 14/090,899 dated Feb. 24, 2016.
Feb. 27, 2016 Reply to Feb. 24, 2016 Notice to File Corrected Application Papers of U.S. Appl. No. 14/090,899.
International Search Report and Written Opinion of International Application No. PCT/US2013/072048 mailed Mar. 4, 2014.
International Search Report and Written Opinion of International Application No. PCT/US2013/072053 mailed Mar. 5, 2014.
Non-Final Office Action of U.S. Appl. No. 14/090,899 mailed May 28, 2015.
International Preliminary Report on Patentability of International Application No. PCT/US2013/072053 mailed Jun. 11, 2015.
International Preliminary Report on Patentability of International Application No. PCT/US2013/072048 mailed Jun. 11, 2015.
Aug. 28, 2015 Reply to May 28, 2015 Non-Final Office Action of U.S. Appl. No. 14/090,899.
Final Office Action of U.S. Appl. No. 14/090,899 mailed Sep. 30, 2015.
Notice of Allowance of U.S. Appl. No. 14/090,899 mailed Feb. 18, 2016.
Chinese Search Report of Chinese Application No. 201380061937.3 dated Nov. 7, 2016.
Nov. 30, 2015 Reply to Sep. 30, 2015 Final Office Action of U.S. Appl. No. 14/090,899.
Hudgens et al., U.S. Appl. No. 13/923,741, titled: Boom Drive Apparatus, Multi-Arm Robot Apparatus, Electronic Device Processing Systems, and Methods for Transporting Substrates in Electronic Device Manufacturing Systems, filed Jun. 21, 2013.
Hudgens et al., U.S. Appl. No. 14/090,899, titled: Multi-Axis Robot Apparatus With Unequal Length Forearms, Electronic Device Manufacturing Systems, and Methods for Transporting Substrates in Electronic Device Manufacturing, filed Nov. 26, 2013.
Chinese Search Report of Chinese Application No. 201380062097.2 dated Mar. 18, 2016.
Taiwan Search Report of Taiwan Application No. 102143467 dated Mar. 10, 2017.
Taiwan Search Report of Taiwan Application No. 102143468 dated May 8, 2017.

* cited by examiner

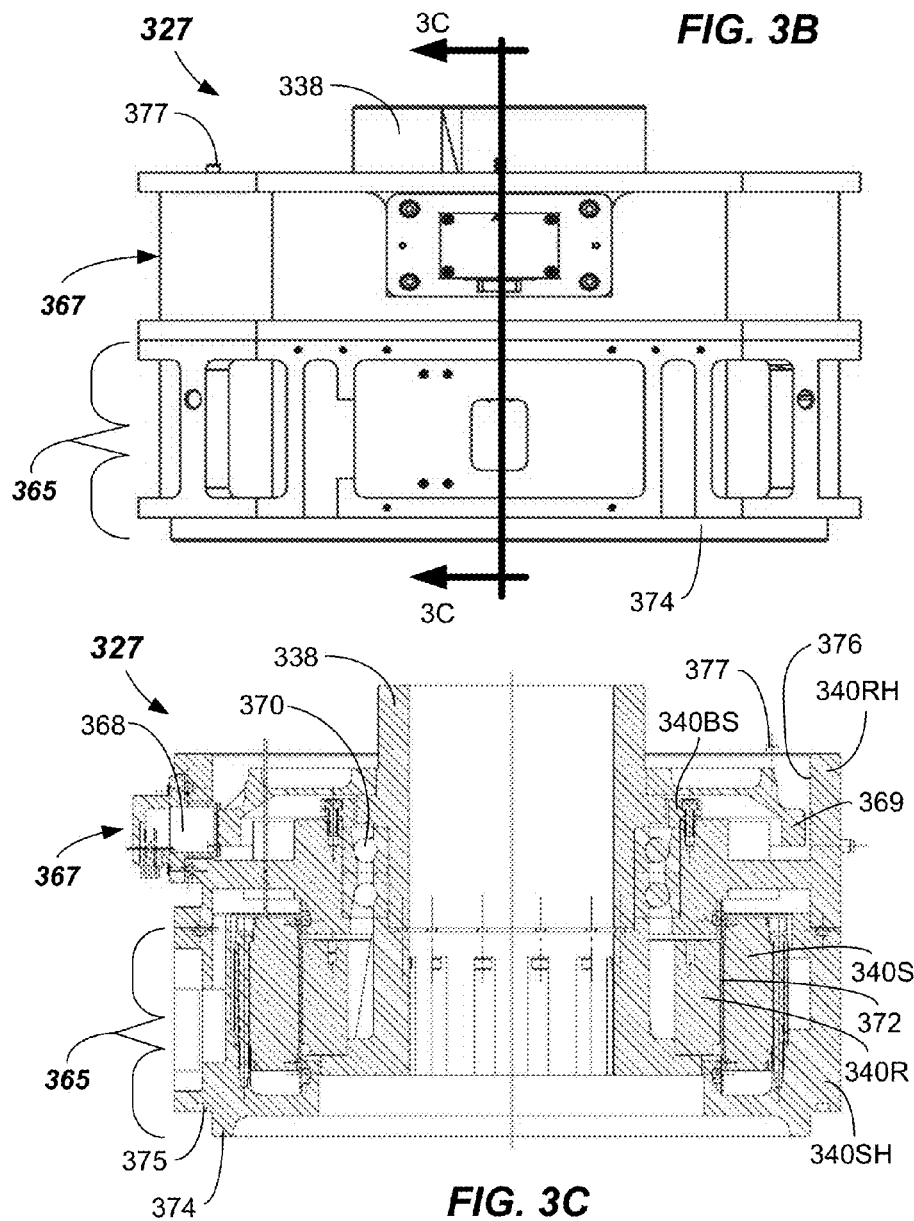

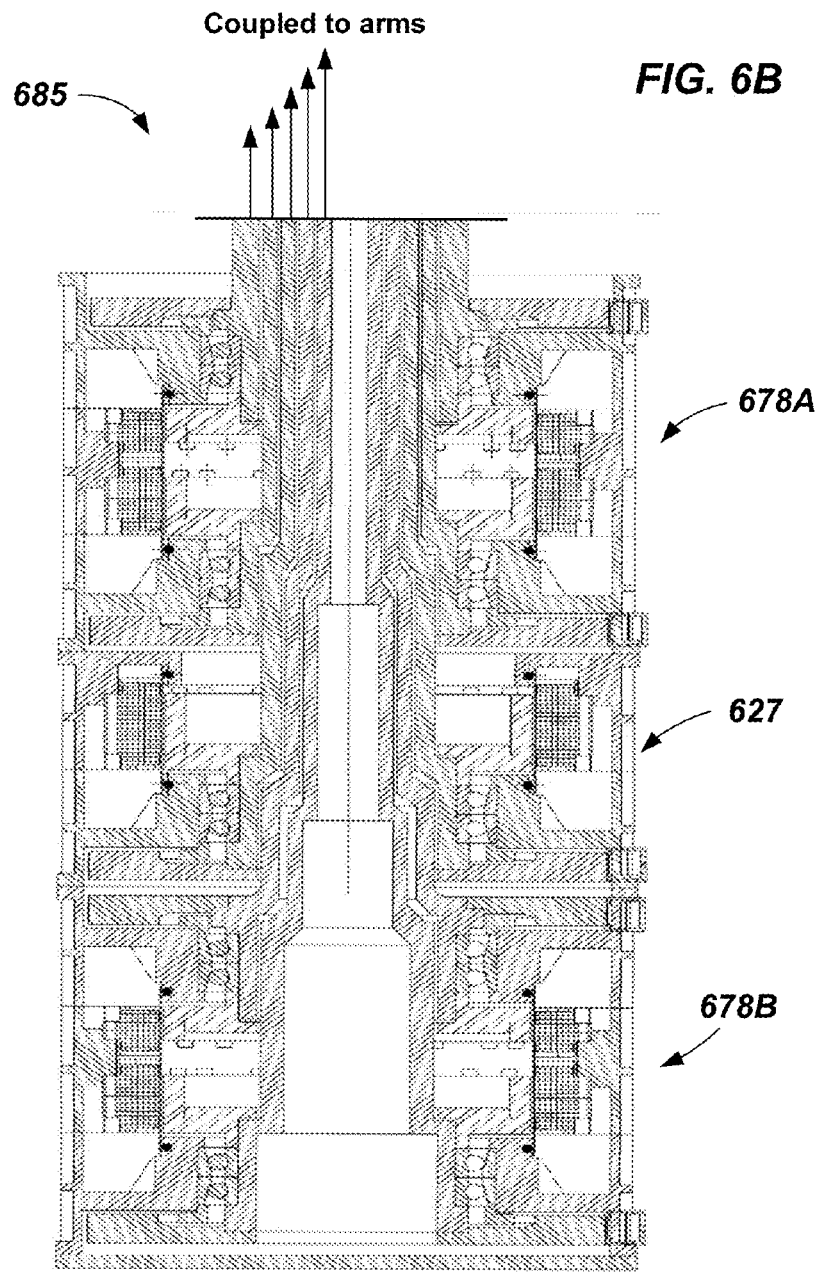

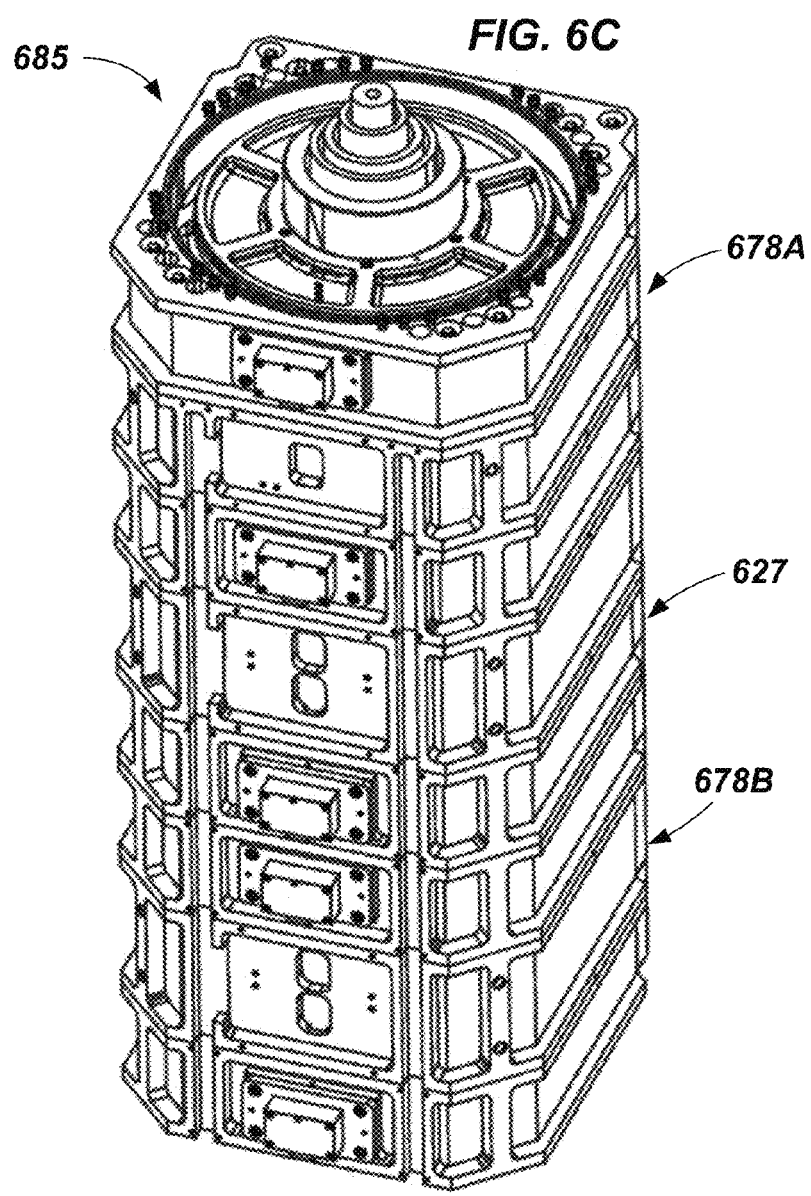

MOTOR MODULES, MULTI-AXIS MOTOR DRIVE ASSEMBLIES, MULTI-AXIS ROBOT APPARATUS, AND ELECTRONIC DEVICE MANUFACTURING SYSTEMS AND METHODS

RELATED APPLICATIONS

The present application claims priority from U.S. patent application Ser. No. 61/732,196, filed Nov. 30, 2012, entitled "MULTI-AXIS ROBOT APPARATUS WITH UNEQUAL LENGTH FOREARMS, ELECTRONIC DEVICE MANUFACTURING SYSTEMS, AND METHODS FOR TRANSPORTING SUBSTRATES IN ELECTRONIC DEVICE MANUFACTURING", which is hereby incorporated herein by reference in its entirety for all purposes

FIELD

The present invention relates to robots, and more specifically to drive motors for robots, such as those adapted to transport substrates in electronic device manufacturing systems.

BACKGROUND

Conventional electronic device manufacturing systems may include multiple process chambers and one or more load lock chambers. Such chambers may be included in cluster tools where a plurality of chambers may be distributed about a transfer chamber, for example. These systems may employ a transfer robot, which may be housed in the transfer chamber, and which may be adapted to transport substrates between the various chambers. Such systems, depending upon the number of robot arms and motion capability may have a drive motor that may have 1-axis, 2-axis, 3-axis, 4-axis, or even 5-axis capability or more. However, such drive motors may be complicated and costly.

Accordingly, less costly drive motors that may be adapted for use in robots for efficient and precise movement of substrates are desired.

SUMMARY

In one or more embodiments, a motor module is provided. The motor module includes a stator assembly including a stator housing and a stator received in the stator housing; a rotor assembly abutting the stator assembly and including: a rotor housing, a drive shaft, a bearing assembly supporting the drive shaft relative to the rotor housing, and a rotor coupled to the drive shaft; and a vacuum barrier member positioned between the rotor and the stator.

In another embodiment, a multi-axis motor drive assembly is provided. The multi-axis motor drive assembly includes a first motor module; and a second motor module, wherein combinations of the first motor module, the second motor module, or both, are assembled to produce a two-axis, three-axis motor, four-axis motor, five-axis motor, or six-axis motor.

In another embodiment, a multi-axis robot apparatus is provided. The multi-axis robot apparatus includes one or more robot arms; a first motor module having one-axis capability coupled to the one or more first robot arm of the one or more robot arms; and a second motor module having two-axis capability coupled to and adapted to move one or more second robot arm of the one or more robot arms.

In a system embodiment, an electronic device manufacturing system is provided. The electronic device manufacturing system includes a transfer chamber; a robot apparatus including robot arms received in the transfer chamber and one or more motor modules coupled to the robot arms, at least one motor module including: a stator assembly including a stator housing and a stator received in the stator housing; a rotor assembly abutting the stator assembly and including: a rotor housing, a drive shaft, a bearing assembly supporting the drive shaft relative to the rotor housing, and a rotor coupled to the drive shaft; and a vacuum barrier member positioned between the rotor and the stator.

In another aspect, a method of assembling a multi-axis drive assembly is provided. The method includes providing a first motor module consisting of one-axis capability; providing a second motor module consisting of two-axis capability; and assembling one or more of the first motor module to one or more of the second motor module to form the multi-axis motor assembly.

Numerous other aspects are provided in accordance with these and other embodiments of the invention. Other features and aspects of embodiments of the present invention will become more fully apparent from the following detailed description, the appended claims, and the accompanying drawings.

BRIEF DESCRIPTION OF THE DRAWINGS

FIG. 3B illustrates a side plan view of a one-axis motor module according to embodiments.

FIG. 3C illustrates a cross-sectioned side view of a one-axis motor module according to embodiments.

FIG. 6B illustrates a cross-sectioned side view of a multi-axis robot apparatus made up of three motor modules according to embodiments.

FIG. 6C illustrates a perspective view of a multi-axis motor drive assembly including three motor modules according to embodiments.

DETAILED DESCRIPTION

Figure 1A:
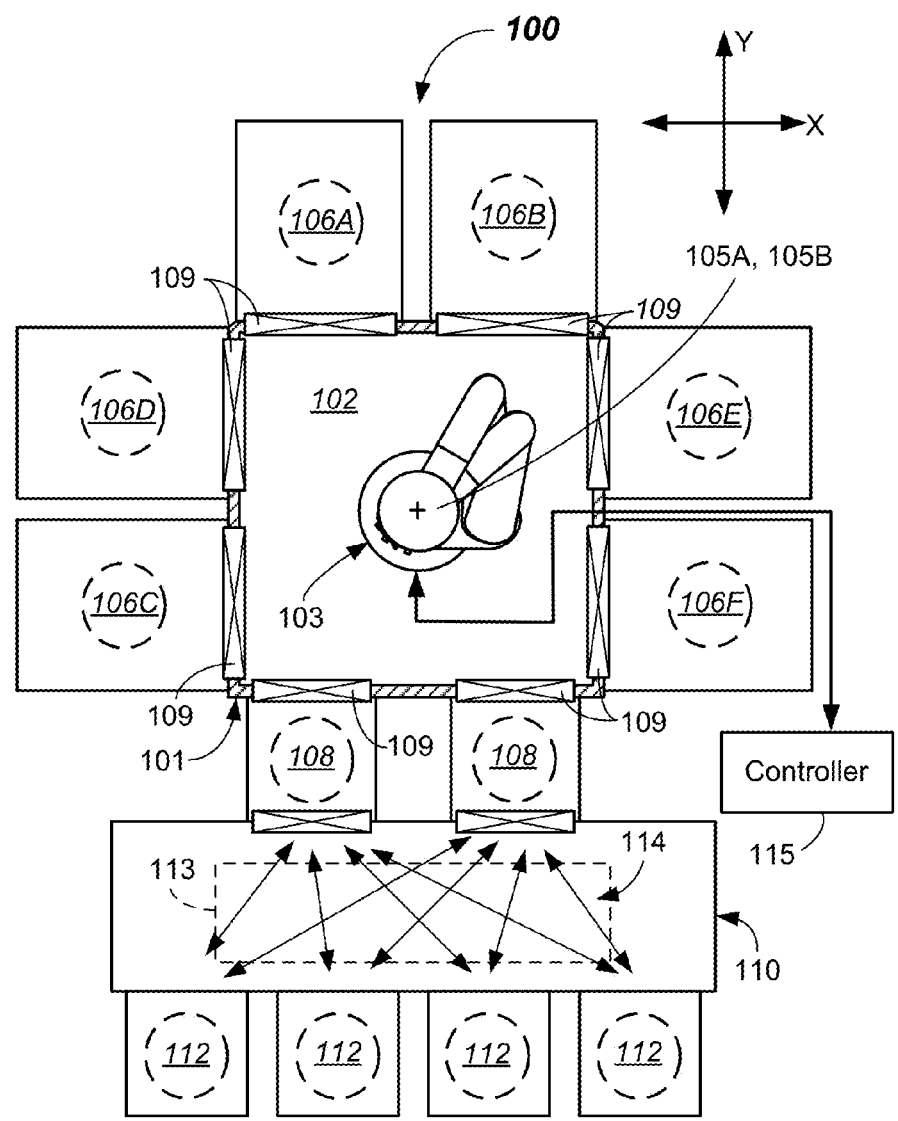
FIG. 1A illustrates a schematic top view of an electronic device manufacturing system including a robot apparatus (e.g., multi-axis robot apparatus) according to embodiments.

Electronic device manufacturing may require very precise and rapid transport of substrates between various locations. In particular, in some embodiments, only a single end effector (sometimes referred to as a "blade") may be used.

In other robot apparatus embodiments, dual end effectors may be attached to the robot apparatus so that a complete substrate exchange may be accomplished at a particular chamber. Such robot apparatus may be multi-axis robots that may be arranged in a transfer chamber with the dual end effectors having an over/under configuration. This allows a first substrate to be extracted from a chamber, and then be immediately replaced at the same chamber with a second substrate. Such robot apparatus include multi-axis drive motors.

In yet further embodiments, the robot apparatus may include independent rotational motion capability of one or more of the robot arms (e.g., independent motion capability of a robot wrist, or of a robot forearm and wrist member). In such multi-axis robot apparatus, 2-axis, 3-axis, 4-axis, 5-axis, or even 6-axis capability or more is desired for operation.

In yet a further embodiment, more than one robot apparatus coupled to a rotatable boom may be driven by a common drive motor, such that more than one chamber (e.g., twinned or side-by-side chambers) may be accessed at once. Depending on the complexity, 5-axis or more capability of the drive motor may be desired.

In the prior art, each motor may result from a specific motor design for that robot arm/capability configuration. However, the motor may be used only on that specific platform, and thus each new robot apparatus would have new motor design made specifically for that new robot configuration.

Therefore, according to one or more embodiments, a multi-axis robot apparatus that may be used for transporting substrates to and from chambers in electronic device manufacturing systems may be provided. The robot apparatus includes a motor drive assembly including modular components.

According to one or more embodiments of the invention, electronic device processing systems including a motor drive assembly having modular components are provided.

According to one or more embodiments of the invention, motor modules are provided. The motor modules include a stator assembly and an abutting rotor assembly. Stator assembly includes a stator housing and a stator received therein. The rotor assembly includes a rotor housing, a drive shaft, a bearing assembly supporting the drive shaft relative to the rotor housing, and a rotor coupled to the drive shaft. A vacuum barrier member (e.g., an annular sleeve) is positioned between the rotor and the stator to retain a vacuum within inner portions of the drive module. Such modules are well adapted for use in vacuum robot apparatus.

According to one or more additional embodiments of the invention, a multi-axis robot apparatus including one or more motor modules are provided. In some embodiments, multi-axis robot apparatus includes one or more robot arms, and a first motor module coupled to one or more of the arms, and a second motor module coupled to one or more other arms. Combinations of one-axis motor modules and two-axis motor modules may be used to assemble 2-axis, three-axis, four-axis, five-axis, or six-axis drive motors. However, it should be recognized that the one-axis motor module may be used to drive a one-axis robot apparatus.

According to one or more additional embodiments of the invention, methods of assembling a robot drive assembly are provided.

Further details of example embodiments of the invention are described with reference to FIGS. 1A-7 herein.

FIG. 1A is a schematic diagram of an example embodiment of an electronic device manufacturing system 100 according to embodiments of the present invention. The electronic device manufacturing system 100 is an apparatus that may include a housing 101 having walls (e.g., floor, ceiling, and sidewalls) and that defines a transfer chamber 102. A robot apparatus 103 including motor modules in accordance with one or more embodiments of the invention may be at least partially housed within the transfer chamber 102. The robot apparatus 103 may include any suitable motion capability depending on the chambers and the orientations thereof. For example, in some embodiments, a single-axis motor may be used. In other embodiments, a multi-axis motor such as a 2-axis motor may be desired. In yet other embodiments, a 3-axis motor, 4-axis motor, 5-axis motor, or even a 6-axis motor, or more, may be used. Each such drive motor assembly may be made of one or more modular motor components. The robot apparatus 103 may be adapted to place or extract substrates (e.g., substrates 105A, 105B) to and from various destinations via operation of the robot apparatus 103, which is described fully below herein.

The destinations may be various process chambers (e.g., process chambers 106A, 106B, 106C, 106D, 106E, 106F) that are coupled to the transfer chamber 102. Optionally, the destinations may be one or more load lock chambers 108, which may be coupled to the transfer chamber 102. Process chambers 106A-106F may be adapted to carry out any number of processes, such as deposition, oxidation, nitration, etching, polishing, cleaning, lithography, or the like. Other processes may also be carried out therein. The load lock chambers 108 may be adapted to interface with a factory interface 110, which may receive one or more substrates from substrate carriers 112 docked at load ports of the factory interface 110.

Substrates may be transferred between the load lock chambers 108 and the substrate carriers 112 by a factory interface service robot 113 (shown dotted) located in the factory interface 110, and the transfer may take place in any sequence or direction as indicated by arrows 114. Substrates 105A, 105B as used herein shall mean articles used to make electronic devices or circuit components, such as silica-containing wafers, glass plates, glass panels, masks, or the like.

In some embodiments, the transfer chamber 102 may be operated under a vacuum, for example. Each of the process chambers 106A-106F and the one or more load lock chambers 108 may include slit valves 109 at their ingress/egress, which may be adapted to open and close when placing or extracting substrates 105A, 105B to and from process chambers 106A-106F and/or one or more load lock chambers 108. Slit valves 109 may be of any suitable conventional construction.

The motion of the various components of the robot apparatus 103 may be controlled by suitable commands from a controller 115 to a drive assembly 111 (FIGS. 1B, 1C) according to one or more embodiments of the invention.

Drive assembly 111 may be made up of one or more motor modules. Signals from the controller 115 to the one or more motor modules of the drive assembly 111 may cause motion of the various arm and other components of the robot apparatus 103 as will be apparent from the following. Suitable feedback may be provided for each component by various sensors, such as position encoders, or the like, as will be fully described below.

Referring to FIGS. 1A-1D, an example robot apparatus 103 including multiple robot arms and a multi-axis motor drive assembly 111 is provided. Robot apparatus 103 may include multiple arms. In the depicted embodiment, the robot apparatus 103 includes a boom 104 rotatable about a primary axis 116. The robot apparatus 103 may also include a base 117 that is adapted to be attached to a wall (e.g., a floor) of the housing 101. However, the robot apparatus 103 may be attached to a ceiling of the housing 101 in some embodiments. Accordingly, the robot apparatus 103 may be at least partially supported by the housing 101.

The robot apparatus 103 includes the multi-axis motor drive assembly that is configured and adapted to drive the various robot arms, such as the boom 104 and other various other robot arms to be described. The boom 104 may be adapted to be rotated about the primary axis 116 in either a clockwise or counterclockwise rotational direction. The rotation may be provided by one or more suitable motor modules of the multi-axis motor drive assembly 111, which may be variable reluctance or permanent magnet electric motors which may be constructed as described further herein below. The rotation of the boom 104 may be controlled by suitable commands to the respective motor modules from the controller 115. Boom 104 is adapted to be rotated in an X-Y plane relative to the base 117 about the primary axis 116. A first motor module 119 of the drive assembly 111 may be used to drive the boom 104. In some embodiment, Z-axis capability may also be provided.

In the depicted embodiment, the robot apparatus 103 includes multiple arms such as a first forearm 118 and a second forearm 120, which may coupled to the boom 104 at a radially outboard end of the boom 104 spaced from the primary axis 116. In the depicted embodiment, the first and second forearms 118, 120 may be each mounted to a first outboard end of the boom 104 at a same outboard location, and may be commonly rotatable about a second axis 122. As shown, the second forearm 120 is shorter than the first forearm 118. Each of the first and second forearms 118, 120 may be independently rotatable relative to the boom 104. Rotation may be +/− about 150 degrees. In the depicted embodiment, the second axis 122 may be spaced from the primary axis 116 by a distance of between about 348 cm and about 522 cm. Other distances may be used.

A first wrist member 124 may be coupled to a first outer location on the first forearm 118 and may be independently rotatable relative to the first forearm 118 about a third axis 126, in some embodiments. The third axis 126 may be spaced from the second axis 122 by a distance of between about 670 cm and about 1004 cm, for example. Other distances may be used. The first wrist member 124 may have a first end effector 128 coupled thereto. First end effector 128 may have any suitable construction and is adapted to carry the substrate 105A to be processed within the electronic device manufacturing system 100. Rotation may be +/− about 150 degrees.

A second wrist member 130 may be coupled to an outer location on the second forearm 120 and rotatable about a fourth axis 132. The fourth axis 132 may be spaced from the second axis 122 by a distance of between about 514 cm and about 772 cm, for example. Other distances may be used. The second center-to center length between axes 122 and 132 may be less than 90% of the first center-to center length between axes 122 and 126, and between about 50% and about 90% of the first center-to center length in some embodiments. In some embodiments, the center-to-center length of the boom 104 between axes 116 and 122 is shorter than the first center-to-center length of the first forearm 118. In some embodiments, the center-to-center length of the boom 104 is shorter than the second center-to-center length of the second forearm 120. Other center-to-center ratios and lengths may be used.

The second wrist member 130 may have a second end effector 134 coupled thereto. Second end effector 134 is adapted to carry the substrate 105B to be processed within the electronic device manufacturing system 100. Second wrist member 130 may be independently rotatable relative to the second forearm 120, in some embodiments. Rotation may be +/− about 150 degrees.

Figure 1B:
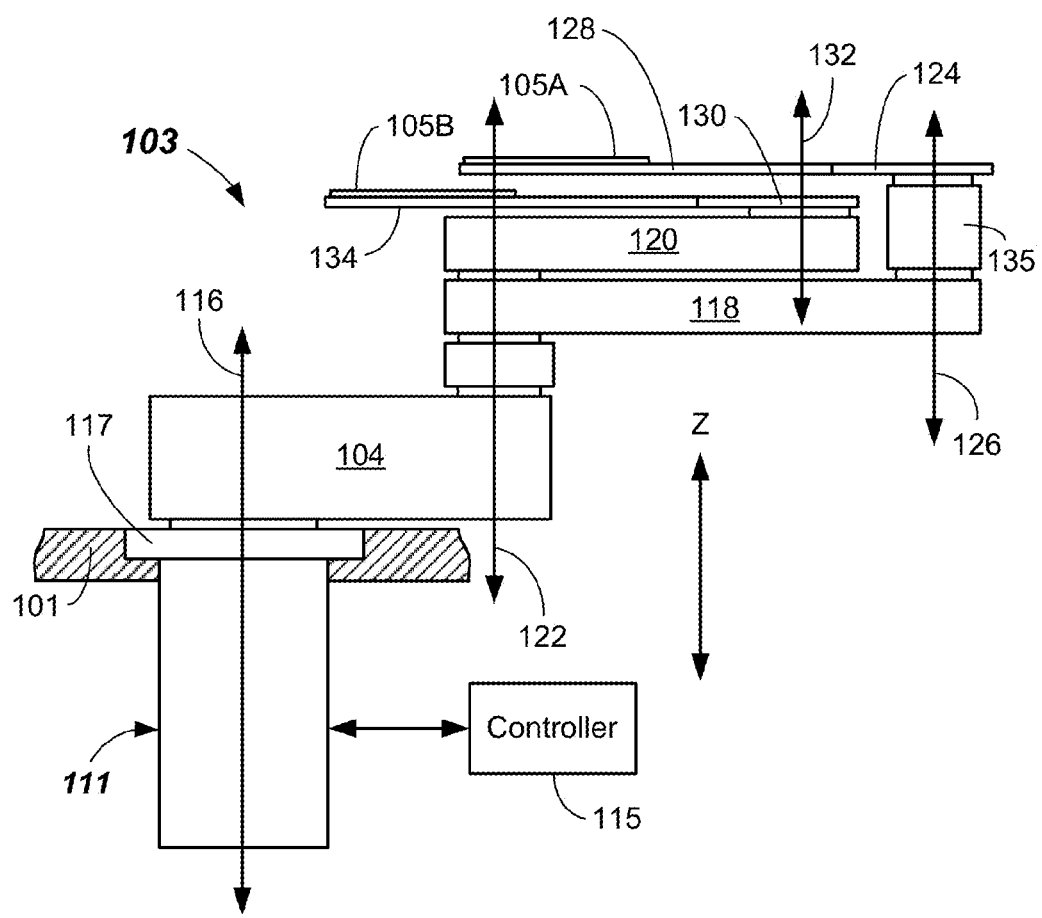
FIG. 1B illustrates a side view of a multi-axis robot apparatus including a multi-axis motor drive assembly including motor modules according to embodiments.

As can be seen in FIG. 1B, the first forearm 118 and first wrist member 124 and first end effector 128 are configured so that they are vertically spaced apart. In particular, a wrist spacer 135 spaces the first wrist member 124 vertically from the first forearm 118. The shorter length of the second forearm 120 allows the second forearm 120 and the second wrist member 130 and attached second end effector 134 to pass between the first forearm 118 and the first wrist member 124 and past the wrist spacer 135 without interference with the wrist joint at the third axis 126.

Coupling this feature with the independent rotation capability of the boom 104, each of the first and second forearms 118, 120, and each of the first and second wrist members 124, 130, provides extreme flexibility in carrying out any desired motion path of the substrates 105A, 105B in the described embodiment.

In the depicted embodiment of FIG. 1A, the robot apparatus 103 is shown located and housed in a transfer chamber 102. However, it should be recognized that this embodiment of robot apparatus 103, as well as the other robot apparatus described herein, may be used in other areas of electronic device manufacturing, such as in a factory interface 110.

In more detail, the multi-axis motor drive assembly 111 for accomplishing rotation of the various robot arms will now be described. In particular, motor modules (e.g., motor drive modules) may be used and adapted to provide independent rotation of each of the boom 104, first and second forearms 118, 120, and first and second wrist members 124, 130 as will now be described in detail.

Figure 1C:
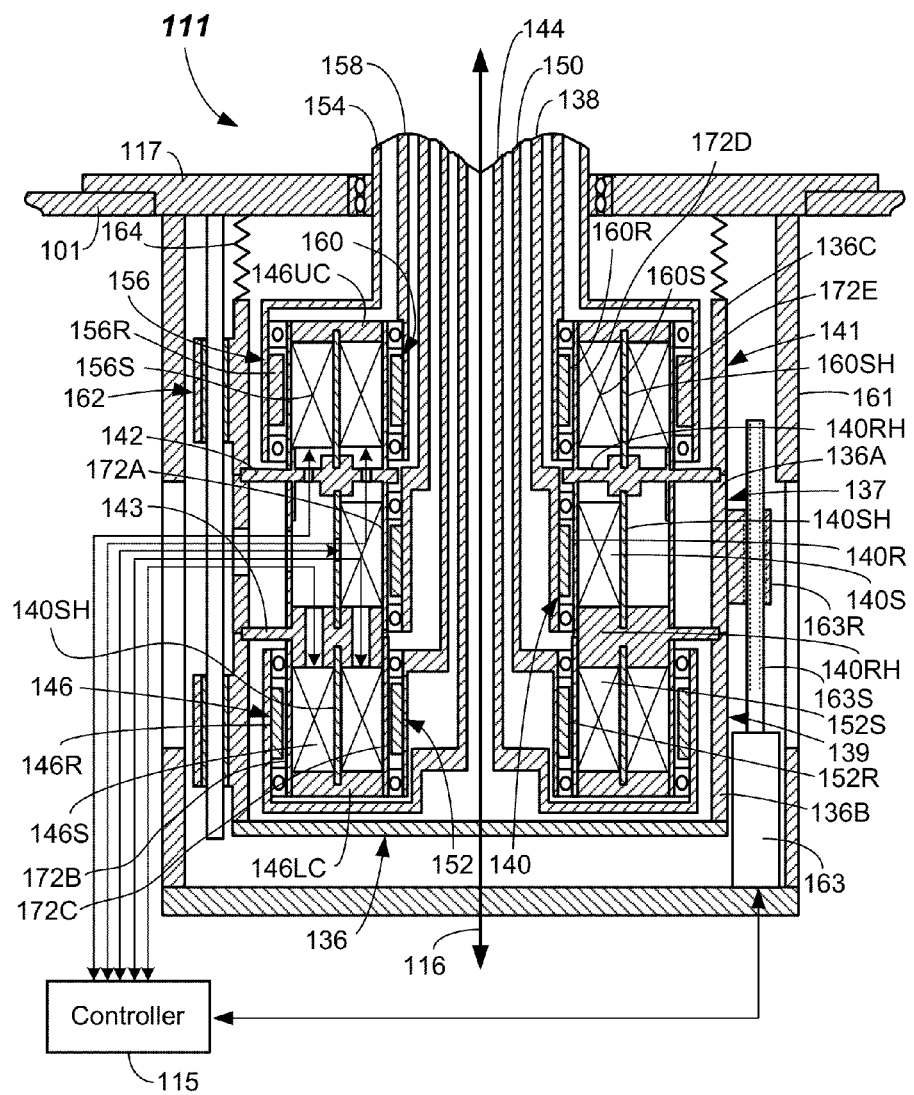
FIG. 1C illustrates a cross-sectioned side view of a multi-axis motor drive assembly including motor modules adapted for driving a multi-axis robot apparatus according to embodiments.

This example embodiment of a multi-axis motor drive assembly 111 is a 5-axis motor drive assembly and may include, as best shown in FIG. 1C. However, the module drive motor invention described herein may be used to assembly multi-axis motor drive assemblies having other multi-axis capabilities (e.g., 2-axis, 3-axis, 4-axis, 5-axis, 6-axis, or more).

Multi-axis motor drive assembly 111 includes a motor housing 136 adapted to contain the various drive motor components. Multi-axis drive motor assembly 111 is made up of multiple stacked motor modules. Multi-axis drive motor assembly 111 may include a first motor module 137 including drive components adapted to independently rotate a first robot arm, such as the boom 104 about the primary axis 116, for example. Rotation may be +/−360 degrees or more. In the depicted embodiment, the first motor module 137 consists of one-axis capability. First motor module 137 may be centrally located between and abut a second motor module 139 and third motor module 141 that are stacked above and below the first motor module 137. Each of the second motor module 139 and third motor module 141 may include 2-axis capability as will be apparent from the following.

A first drive shaft 138 may extend from the boom 104 and may be supported by a suitable bearing assembly. Bearing assemblies (e.g., race ball bearings) of each of the respective motor modules 137, 139, 141 may be arranged to have an inner bearing race of a substantially same diameter for engaging their respective drive shafts, which may be of different lengths. First drive shaft 138 is adapted to be rotated by a first drive motor 140 of the first motor module 137.

First drive motor 140 may be an electrical motor including a rotor assembly and a stator assembly, including a first rotor 140R and first stator 140S, for example. First rotor 140R may be a magnet or a plurality of arranged magnets and may be coupled to an outside lower surface the first drive shaft 138. In some embodiments, the rotor assembly including the first rotor 140R may include a plurality of magnets (e.g., bar magnets) arranged around the outer periphery of first drive shaft 138, or magnets arranged around the periphery of a rotor support, which is coupled to the first drive shaft 138. First rotor 140R may be supported on rotor housing 140RH, which may include inner regions of an upper bulkhead 142 and/or inner regions of the lower bulkhead 143.

First stator 140S may be secured to a stator housing 140SH, which may be supported by one or both of the upper bulkhead 142 and the lower bulkhead 143. A suitable conventional rotational encoder (not shown) may be used in some embodiments to position the boom 104 as desired. A vacuum barrier 172A may be positioned between the rotor 140R and the stator 140S. Vacuum barrier 172A may be an annular sleeve, and may function to retain a vacuum to an inner portion of the multi-axis motor drive assembly 111.

Furthermore, the multi-axis motor drive assembly 111 may include drive components adapted to independently rotate another robot arm, such as the first forearm 118 about the second axis 122 located at an outboard end of the boom 104. The drive components may include a second drive shaft 144 and a second drive motor 146, which may be part of the second motor module 139. Rotation of the second drive motor 146 causes rotation of the second drive shaft 144 (e.g., a center-most drive shaft) and may drive the coupled first forearm 118 about the second axis 122. The second drive motor 146 may be an electrical motor including a second rotor 146R and second stator 146S. The second drive shaft 144 may extend from a drive system of the robot apparatus 103 (See FIG. 1D), and may be supported by a suitable bearing assembly. Driving the second drive motor 146 via drive signals from the controller 115 may cause independent rotation of the first forearm 118 relative to the boom 104. Suitable conventional rotational encoders (not shown) may be used to position the first forearm 118 relative to the boom 104, as desired.

Second stator 146S may be secured to, or supported by a stator housing 146SH, which may be supported by or integral with an outer portion of the lower bulkhead 143 and/or an outer portion of the lower rotor cap 146C. Rotor 146R may be supported by the lower rotor cap 146C and/or the outer portion of the lower bulkhead 143, which function as the rotor housing. Upper and lower bulkheads 142, 143 may be secured to, or part of, the motor housing 136. Motor housing 136 may include motor housing portions 136A, 136B, 136C corresponding to first, second, and third motor modules 137, 139, 141, respectively. A vacuum barrier 172B may be positioned between the rotor 146R and the stator 146S. Vacuum barrier 172B may be an annular sleeve as before described, and may function to retain a vacuum to certain inner portions of the multi-axis motor drive assembly 111.

Drive assembly 111 may also include drive components adapted to independently rotate another robot arm, such as the first wrist member 124 about the third axis 126 located at an outer location on the first forearm 118. The drive components may include a third drive shaft 150 and a third drive motor 152. Rotation of the third drive motor 152 causes rotation of the third drive shaft 150 and drives the coupled first wrist member 124 about the third axis 126. The third drive motor 152 may be an electrical motor including a third rotor 152R and third stator 152S. The third drive shaft 150 may extend from the boom drive system, and may be supported by a suitable bearing assembly. Third drive motor 152 may be driven via drive signals from the controller 115 to cause independent rotation of the first wrist member 124 about the third axis 126 relative to the first forearm 118. Suitable conventional rotational encoders (not shown) may be used to position the first wrist member 124 relative to the first forearm 118, as desired. Third rotor 152R may be secured to, or supported by, lower bulkhead 143 and/or the lower rotor cap 146LC, which may function as the rotor housing. Third stator 152S may be secured to, or supported by, the second stator housing 140SH. A vacuum barrier 172C may be positioned between the rotor 152R and the stator 152S. Vacuum barrier 172C may be as before described, and may function to retain a vacuum to certain inner portions of the multi-axis motor drive assembly 111.

Furthermore, the multi-axis motor drive assembly 111 may include drive components adapted to independently rotate another robot arm, such as the second forearm 120 about the second rotational axis 122. The drive components may include a fourth drive shaft 158 and a fourth drive motor 160. Rotation of the fourth drive motor 160 causes a rotation of the fourth drive shaft 158 and drives the coupled second forearm 120 about the second rotational axis 122. The fourth drive motor 160 may be an electrical motor including a fourth rotor 160R and fourth stator 160S. The fourth drive shaft 158 may extend from a boom drive system (FIG. 1D), and may be supported by a suitable bearing assembly. Driving the fourth drive motor 160 via drive signals from the controller 115 causes independent rotation of the second forearm 120 about the second rotational axis 122. Suitable conventional rotational encoders (not shown) may be used to position the second forearm 120 relative to the boom 104, as desired.

Fourth rotor 160R may be secured to, supported by or integral with, inner region of the upper bulkhead 142 and/or the upper rotor cap 146UC, which may function as the rotor housing. Fourth stator 160S may be secured to, or supported by, the fourth stator housing 160SH. Fourth stator housing 160SH may be supported by, or integral with, inner portion of upper rotor cap 146UC and inner portion of upper bulkhead 142. A vacuum barrier 172D may be positioned between the rotor 160R and the stator 160S. Vacuum barrier 172D may be as before described, and may function to retain a vacuum to certain inner portions of the multi-axis motor drive assembly 111.

Drive assembly 111 may also include drive components adapted to independently rotate another robot arm, such as the second wrist member 130 about the fourth axis 132. The drive components may include a fifth drive shaft 154 and a fifth drive motor 156. Rotation of the fifth drive motor 156 causes rotation of the fifth drive shaft 154 and drives the coupled second wrist member 130 about the fourth axis 132. The fifth drive motor 156 may be an electrical motor including a fifth rotor 156R and fifth stator 156S. The fifth drive shaft 154 may extend from the boom drive system, and may be supported by a suitable bearing assembly. Fifth drive motor 156 may be driven via drive signals from the controller 115 to cause independent rotation of the second wrist member 130 relative to the second forearm 120. Suitable conventional rotational encoders (not shown) may be used to position the second wrist member 130 relative to the second forearm 120 as desired.

Fifth stator 156S may be secured to, or supported by a stator housing 160SH, which may be supported by a portion of the upper bulkhead 142 and/or upper rotor cap 146UC. A separate housing may be used in some embodiments. Fifth rotor 156R may be supported by the upper rotor cap 146UC and/or the outer portion of the upper bulkhead 142, which function as the rotor housing. A vacuum barrier 172E may be positioned between the rotor 156R and the stator 156S. Vacuum barrier 172E may be as before described, and may function to retain a vacuum to certain inner portions of the multi-axis motor drive assembly 111.

Additionally, the drive assembly 111 may include Z-axis motion capability in some embodiments. In particular, the motor housing 136 may be restrained from rotation relative to an outer casing 161 by a motion restrictor 162. Motion restrictor 162 may be two or more linear bearings or other bearing or slide mechanisms that function to constrain rotation of the motor housing 136 relative to the outer casing 161, yet allow Z-axis motion of the motor housing 136 (along the direction of the primary axis 116). The vertical motion may be provided by a vertical motor 163. Rotation of the vertical motor 163 may operate to rotate a lead screw 163S in receiver 163R coupled to or integral with motor housing 136. This vertically translates the motor housing 136, and thus the connected robot arms, such as boom 104, forearms 118, 120, wrist members 124, 130, end effectors 128, 134, and, thus, also raises or lowers the substrates 105A, 105B. A suitable seal 164 may seal between the motor housing 136 and the base 117 thereby accommodating the vertical motion and retaining the vacuum within the chamber 102 and portions of the multi-axis motor drive assembly 111. A metal bellows or other like flexible seal may be used for the seal 164.

Figure 1D:
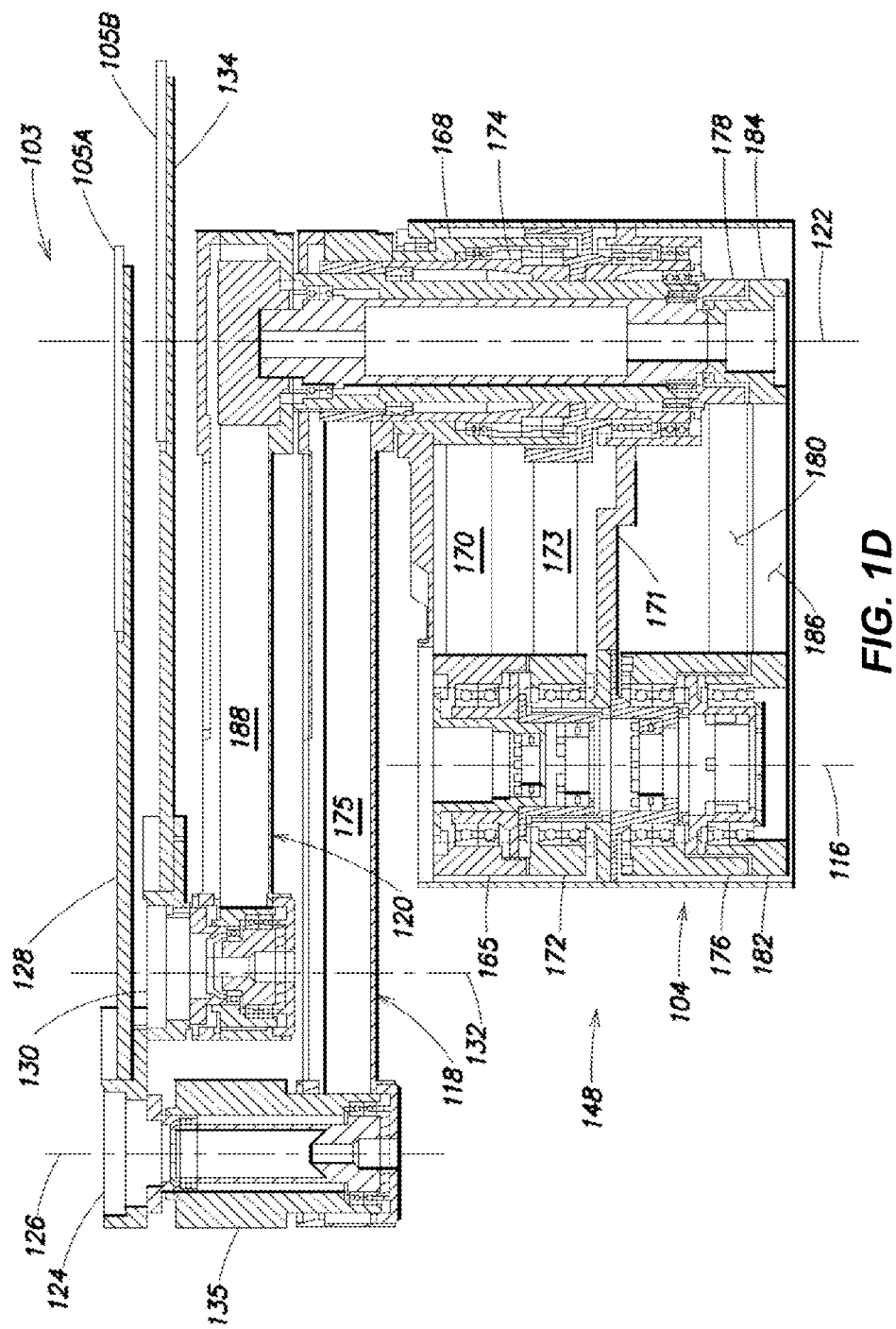
FIG. 1D illustrates a side cross-sectioned view of a multi-axis robot apparatus according to embodiments.

Now referring to FIG. 1D, an example boom drive system 148 that may be adapted to couple with the multi-axis motor drive assembly 111 will be described in detail. The boom drive system 148 may include drive components such as pulleys and belts that are configured and adapted to couple the various drive shafts described above, and also to the first forearm 118, second forearm 120, first wrist member 124, and second wrist member 130.

The drive components may include a first forearm drive member 165 that may be coupled to the second drive shaft 144, a first forearm driven member 168 that is coupled to the first forearm 118 and a first forearm transmission member 170 coupled between the first forearm drive member 165 and the first forearm driven member 168. Rotation of the second drive shaft 144 therefore may rotate the first forearm 118. Each of the first forearm drive member 165 and first forearm driven member 168 may be mounted by bearings to a rigid web portion 171 of the boom 104.

The boom drive system 148 may include a first wrist drive member 172 and a first wrist driven member 174. The first wrist drive member 172 is coupled to the third drive shaft 150 and the first wrist driven member 174 is coupled to the first wrist member 124. A first wrist transmission member 173 couples the first wrist drive member 172 to the first wrist driven member 174 above the web portion 171. Coupling to the first wrist member 124 is provided by a first intermediate transmission member 175 coupling the first wrist driven member 174 to the first wrist member 124 through the first forearm 118. The first intermediate transmission member 175 may coupled to the first wrist member 124 below the wrist spacer 135. The first wrist member 124 may be rotatable about the third axis 126 via bearings mounted in the wrist spacer 135. Wrist spacer 135 functions to suitably space the first end effector 128 above the second end effector 134.

Again referring to FIG. 1D, the boom drive system 148 may include drive components such as pulleys and belts that are adapted to drive the second forearm 120. The drive components may include a second forearm drive member 176 that is coupled to the fourth drive shaft 158, a second forearm driven member 178 that is coupled to the second forearm 120 and a second forearm transmission member 180 coupled between the second forearm drive member 176 and the second forearm driven member 178. Rotation of the fourth drive shaft 158 therefore rotates the second forearm 120. Each of the second forearm drive member 176 and second forearm driven member 178 may be mounted by bearings to a rigid web portion 171 of the boom 104.

The boom drive system 148 may include a second wrist drive member 182 and a second wrist driven member 184. The second wrist drive member 182 is coupled to the fifth drive shaft 154 and the second wrist driven member 184 is coupled to the second wrist member 130. A second wrist transmission member 186 couples the second wrist drive member 182 to the second wrist driven member 184 below the web portion 171. Coupling to the second wrist member 130 is provided by a second intermediate transmission member 188 coupling the second wrist driven member 184 to the second wrist member 130 through the second forearm 120. The second wrist member 130 may be rotatable about the fourth axis 132 via bearings mounted in an outer end location of the second forearm 120.

Figure 2:
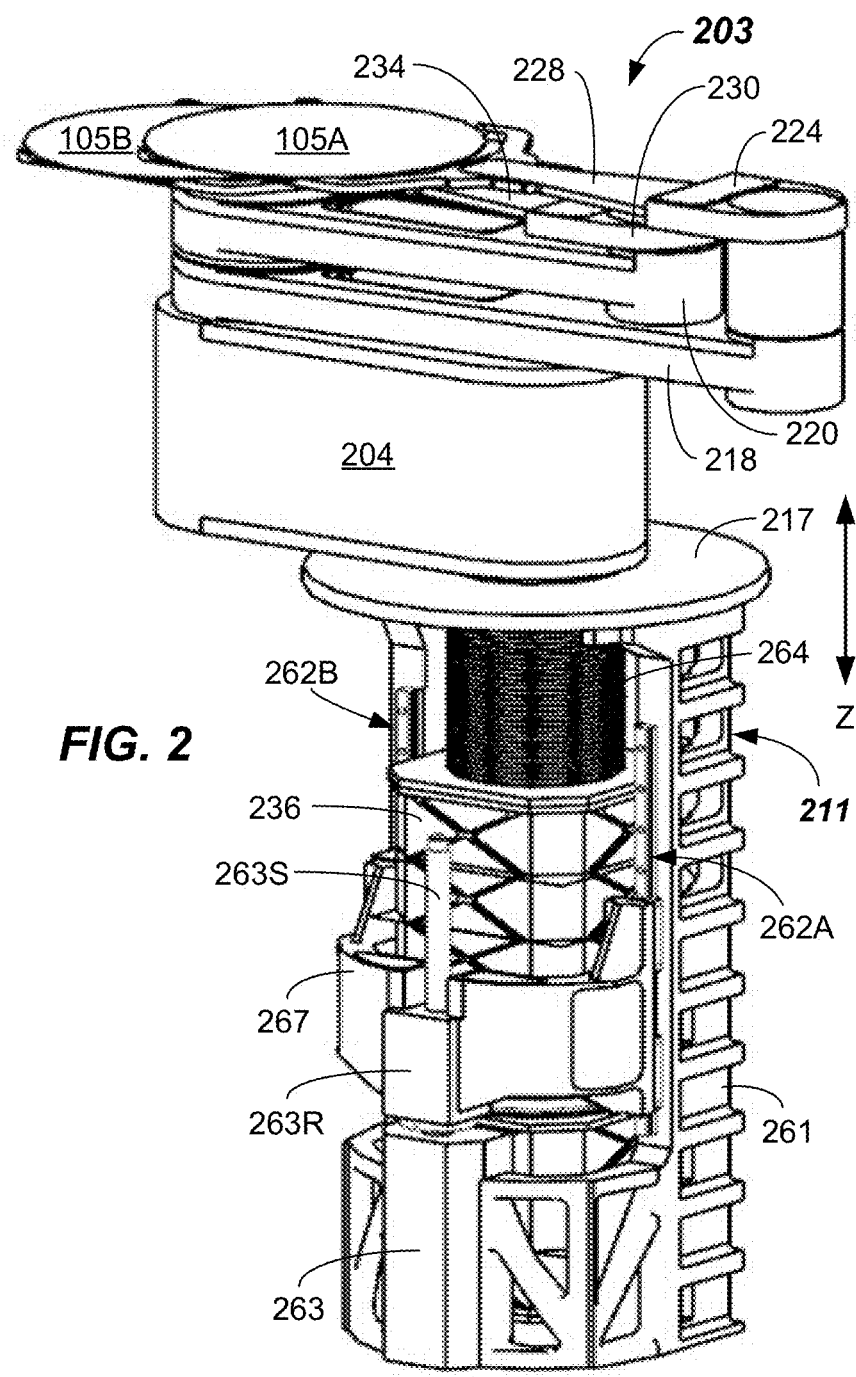
FIG. 2 illustrates a perspective view of a multi-axis robot apparatus including a multi-axis motor drive assembly according to embodiments

FIG. 2 illustrates another multi-axis robot apparatus 203 according to embodiments that may be adapted for use within an electronic device manufacturing system 100. Multi-axis robot apparatus 203 includes a multi-axis motor drive assembly 211 that includes motor modules. The multi-axis robot apparatus 203 may include a plurality of independently actuatable robot components or arms, such as independently rotatable boom 204, independently rotatable first and second forearms 218, 220, and independently rotatable first and second wrist members 224, 230. This configuration may be adapted to insert a first end effector 228 carrying a substrate 105A into a chamber (not shown); while a second end effector 234 carrying a second substrate 105B may be prepositioned adjacent to another chamber. Note that the robot apparatus 203 is shown in a folded condition. In the folded condition, the substrates 105A, 105B may not lie directly above one another, i.e., their centers may be horizontally offset when the forearms 218, 220, wrist members 224, 230, and end effectors 228, 234 are vertically aligned. This may reduce particle contamination of the lower substrate 105B. However, other configurations are possible.

In more detail, the multi-axis robot apparatus 203 includes a multi-axis motor drive assembly 111 having a motor housing 236 containing drive motors like drive motors 140, 146, 152, 156, and 160 (FIG. 1C) and an outer casing 261, which may be embodied in motor modules. Vertical Z-axis capability may be provided that may lift and lower the boom 204 and connected components, and, thus, the substrates 105A, 105B. In operation, the motor housing 236 may be restrained from rotation relative to an outer casing 261 by one or more motion restrictors 262A, 262B. Motion restrictors 262A, 262B may be two or more vertically oriented linear slide mechanisms coupled to a carriage 267. The carriage 267 is secured to the motor housing 236 or integral therewith. The motion restrictors 262A, 262B function to constrain rotation of the motor housing 236 relative to the outer casing 261, yet allow Z-axis motion of the motor housing 236. The vertical motion is provided by a vertical motor 263 coupled to the outer casing 261. Rotation of the vertical motor 263 may rotate a lead screw 263S in a receiver 263R coupled to or integral with the carriage 267 or motor housing 236. This vertically translates the motor housing 236, and thus the connected boom 204, first and second forearms 218, 220, first and second wrist members 224, 230, first and second end effectors 228, 234, and, thus, the substrates 105A, 105B. A suitable seal 264 may seal between the motor housing 236 and the base 217 thereby accommodating the vertical motion and retaining a vacuum within the chamber (e.g., chamber 102) the robot 203 is operative in. A metal bellows or other like flexible seal may be used for the seal 264. The multi-axis motor drive assembly 111 may include 5-axis capability and includes stacked motor modules. Various motor modules that may be used to make up and assemble the multi-axis motor drive assembly 111 will now be described.

FIGS. 3A-3D illustrates another embodiment of a motor module 327. In this embodiment, the motor module consists of one-axis capability. Motor module 327 includes a stator assembly 365 and a rotor assembly 367. Rotor assembly 367 may be arranged in an abutting relationship to the stator assembly 365, and some portion of the rotor assembly 367 may be received inside of the stator assembly 365.

Stator assembly 365 includes a stator housing 340SH and a stator 340S received in the stator housing 340SH. Stator 340S may include a plurality of wound stator elements 340E arranged in a circular orientation, as shown in cross-section in FIG. 3D.

Rotor assembly 367 includes a rotor housing 340RH, a drive shaft 338, a bearing assembly 370 supporting the drive shaft 338 relative to the rotor housing 340RH, and a rotor 340R coupled to the drive shaft 338. In the depicted embodiment, the rotor assembly 367 comprises a rotor support 340RS coupled to the rotor 340R. Rotor support 340RS may couple to the end of the drive shaft 338 and function to couple the rotor 340R to the drive shaft 338. Rotor support 340RS may also function to secure an inner race of the bearing assembly 370 to the drive shaft 338. A bearing support 340BS may be provided to secure an outer race of the bearing assembly 370 to the rotor housing 340RH. In this embodiment, the motor module 367 consists of a single drive shaft. The length of the drive shaft 338 may be selected based on its location within a multi-axis motor drive assembly and the particular robot apparatus that it is driving.

Motor module 327 may also include a first encoder element 368 coupled to the rotor housing 340RH, and a second encoder element 369 coupled to the drive shaft 338. Once calibrated, encoder elements 368, 369 provide a signal indicative or the rotational orientation of the drive shaft 338 relative to the rotor housing 340RH, which may be used to properly orient the robot arm or arms that are coupled to the shaft 338.

Figure 3A:
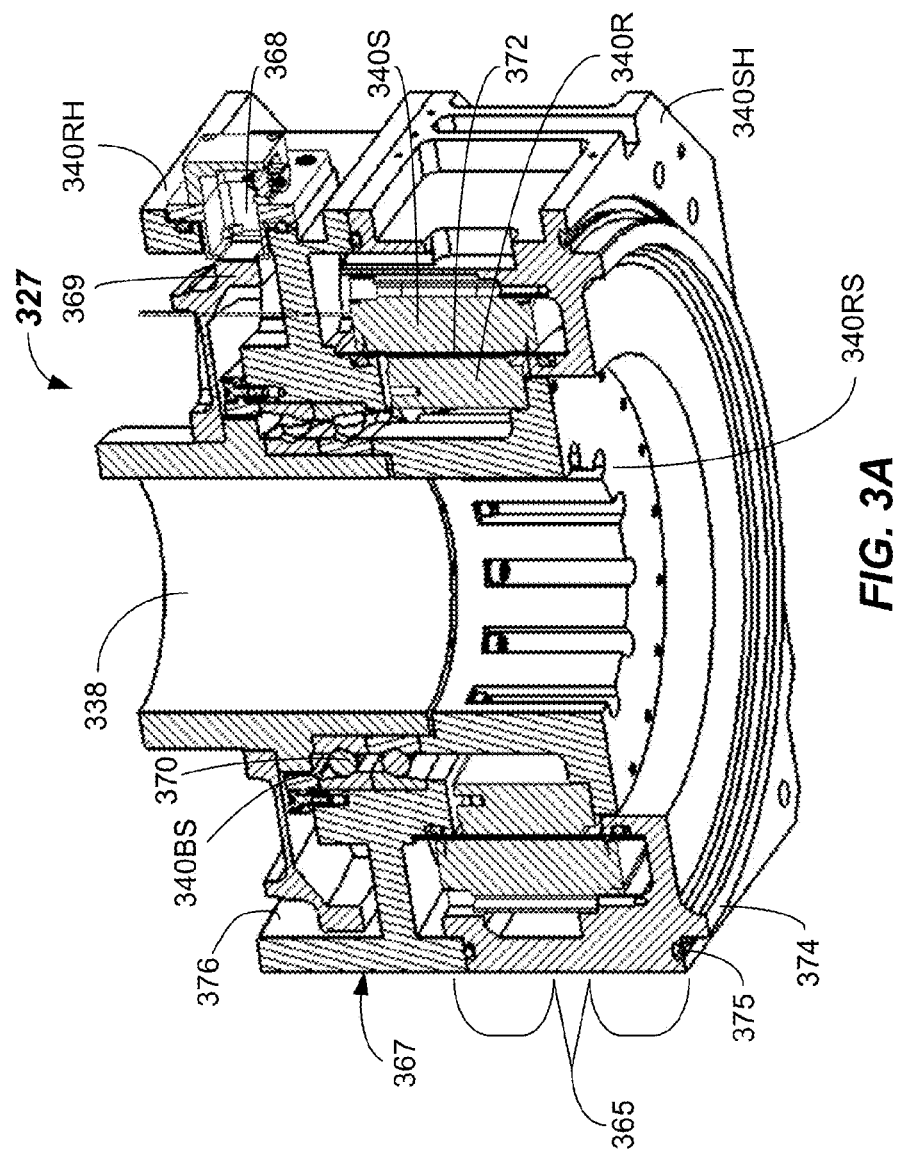
FIG. 3A illustrates a cross-sectioned perspective view of a one-axis motor module according to embodiments.
Figure 3D:
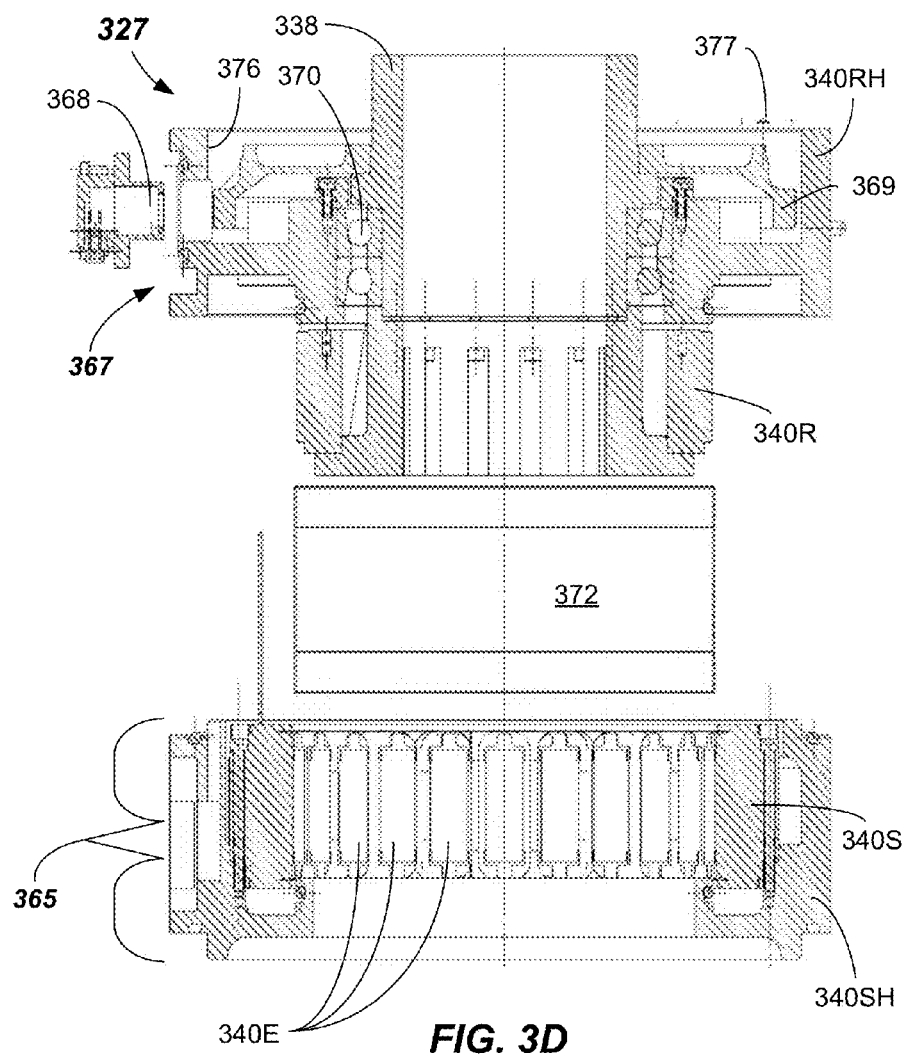
FIG. 3D illustrates an exploded view of a one-axis motor module according to embodiments.
Figure 4A:
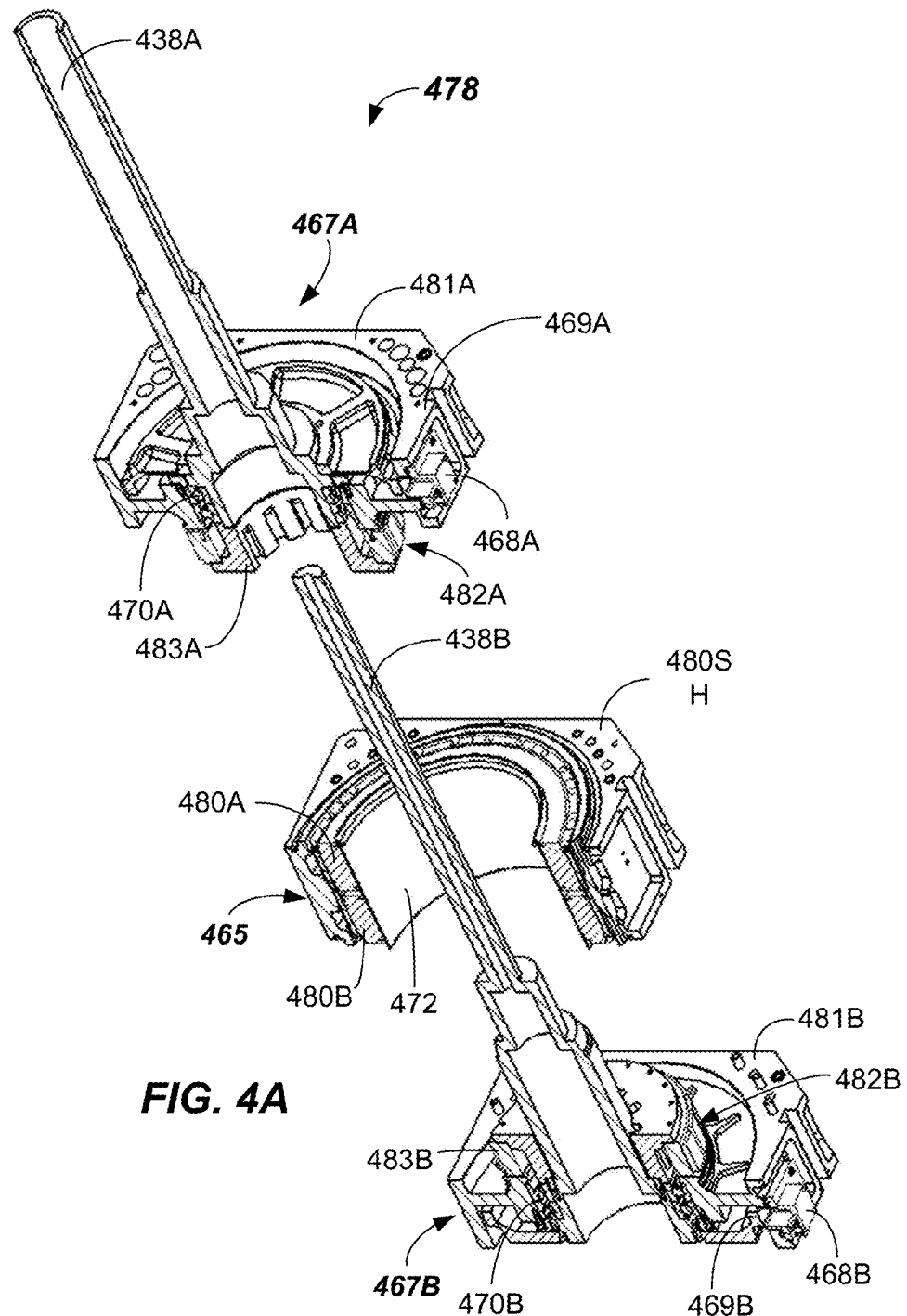
FIG. 4A illustrates an exploded view of a two-axis motor module according to embodiments.
Figure 4B:
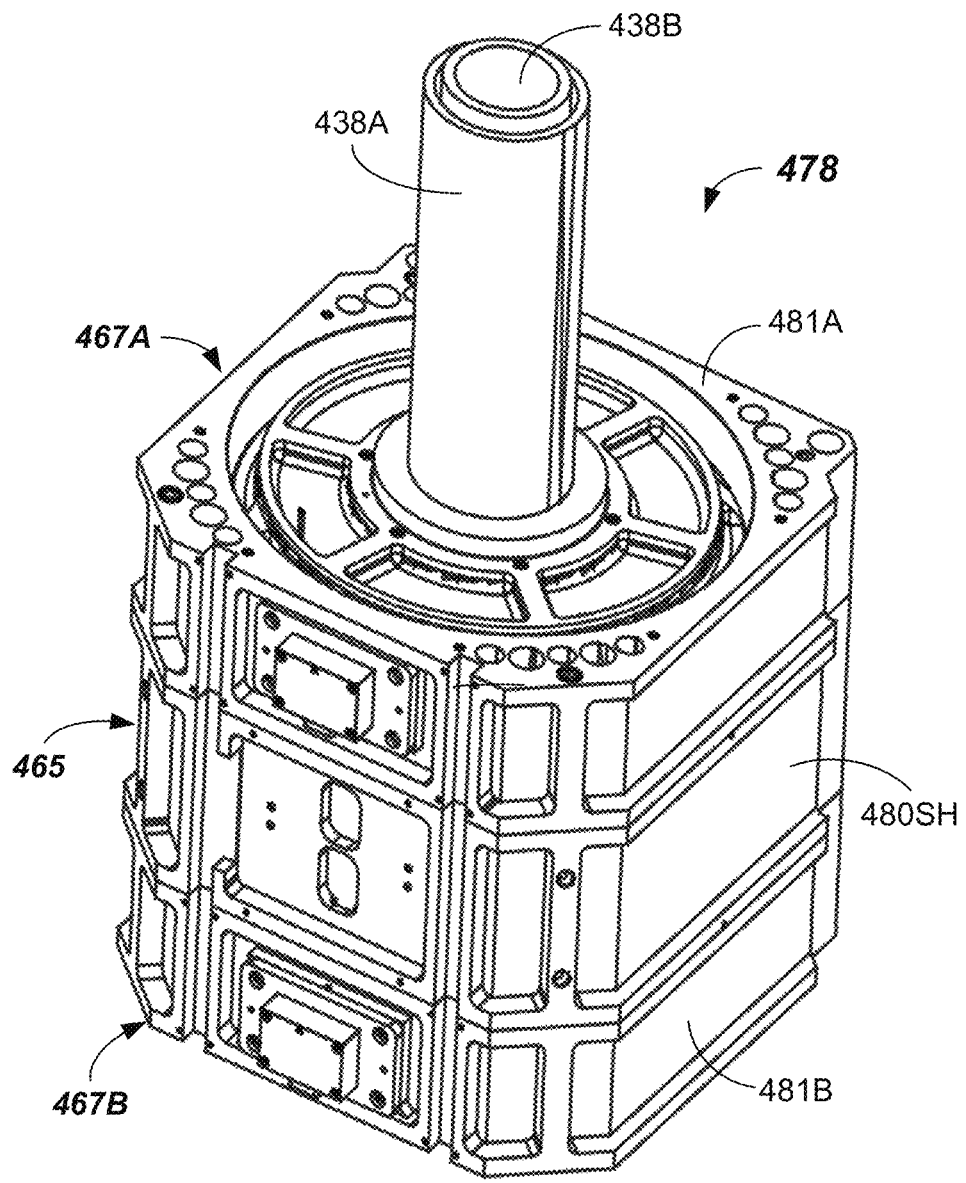
FIG. 4B illustrates a perspective view of a two-axis motor module according to embodiments.
Figure 4C:
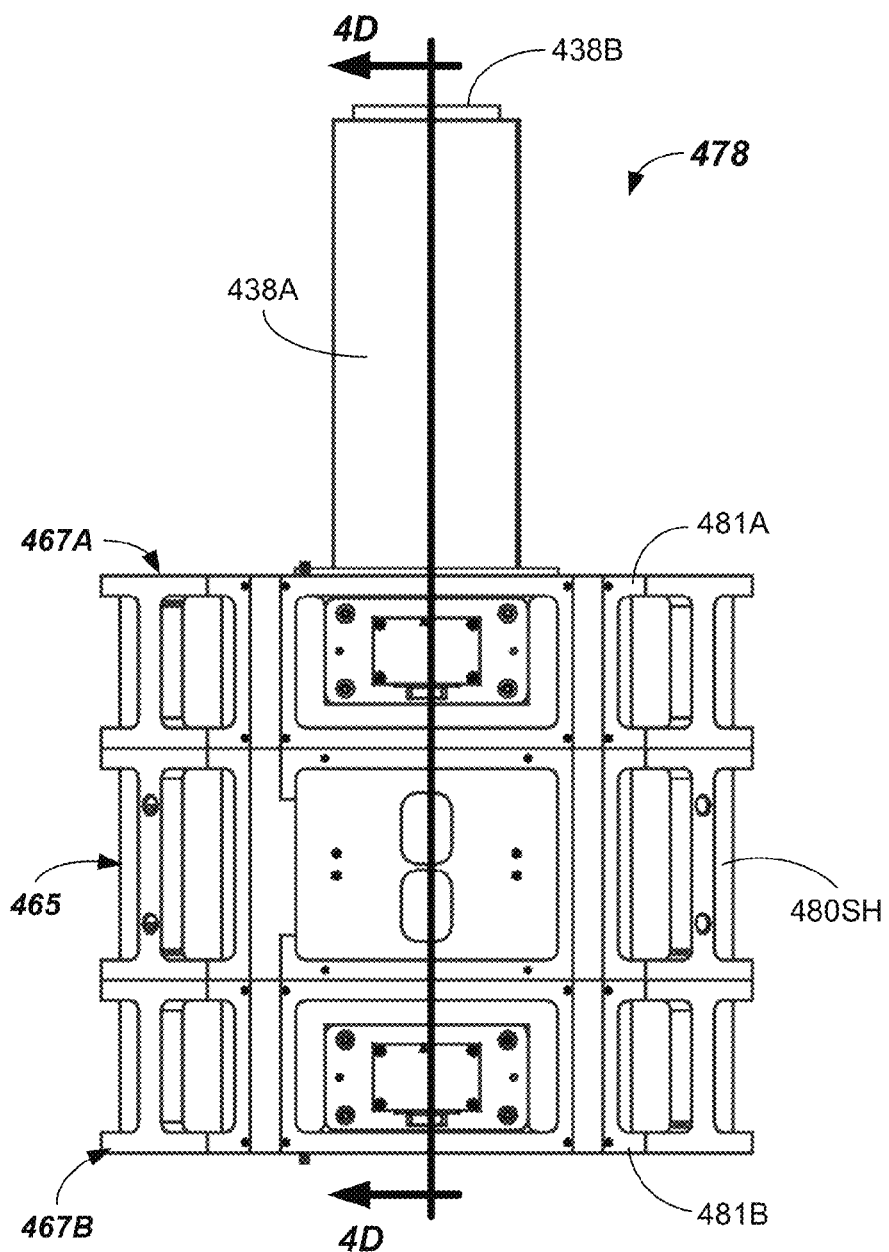
FIG. 4C illustrates a side plan view of a two-axis motor module according to embodiments.
Figure 4D:
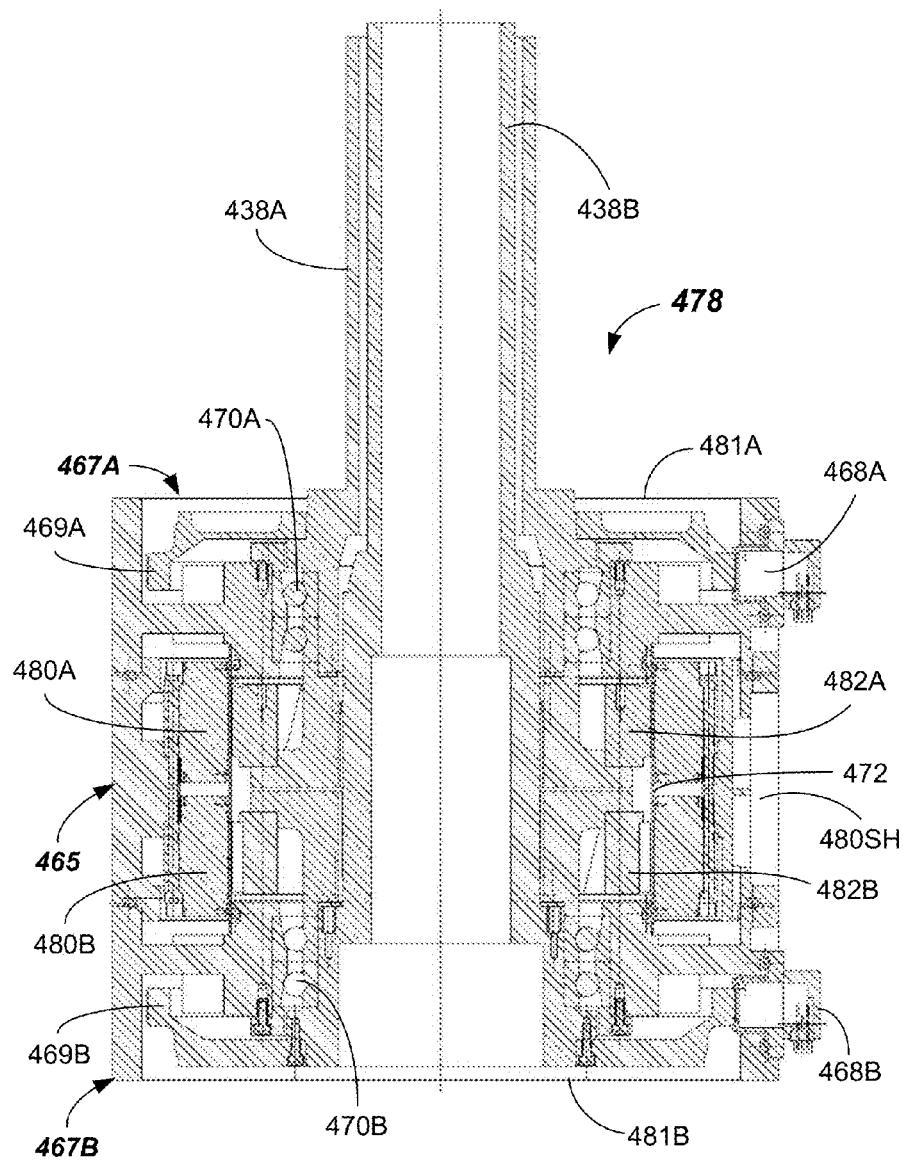
FIG. 4D illustrates a cross-sectioned side view of a two-axis motor module according to embodiments.

Motor module 327 also includes a vacuum barrier member 372 positioned between the rotor 340R and the stator 340S. In the depicted embodiment, the vacuum barrier member 372 comprises an annular sleeve, which extends between the stator housing 340SH and the rotor housing 340RH and seals against the stator housing 340SH and the rotor housing 340RH. Sealing may take place at respective ends of the annular sleeve. Sealing may be provided by any suitable seals (e.g., by elastomeric O-rings) provided in grooves formed in extending annular portions of the respective stator housing 340SH and the rotor housing 340RH, as best shown in FIGS. 3A and 3C. Other suitable vacuum tight seals may be used to retain a vacuum within the inner confines of the motor module 327.

The motor module 327 may include various registration features adapted to orient the motor module 327 axially and/or rotationally relative to other motor modules. Registration features may include a lower axial registration feature 374 (e.g., an annular lip) and possibly a sealing groove 375 adapted to receive a seal (e.g., an elastomeric O-ring seal) on a lower surface of the stator housing 340SH. The motor module 327 may include an upper axial registration feature 376 and/or a rotational registration feature 377 (e.g., a pin) on an upper surface of the rotor housing 340RH. These registration features allow the motor module 327 to be stacked above and/or below another motor module, such that a multi-axis motor drive assembly (e.g., a 2-axis, 3-axis, 4-axis, 5-axis, 6-axis motor drive assembly, or more) may be assembled.

FIGS. 4A-4D illustrates another embodiment of a motor module 478. This embodiment of motor module 478 consists of two-axis capability. Motor module 478 includes a stator assembly 465, a first rotor assembly 467A coupled to the stator assembly 465 on a first side, and a second rotor assembly 467B coupled to the stator assembly 465 on a second side that is opposite the first side. As assembled, first and second rotor assemblies 467A, 467B may be arranged in an abutting relationship to the stator assembly 465 to make up the motor module 478, which is a multi-axis motor module.

In the depicted embodiment, the stator assembly 465 includes a stator housing 480SH, and a first stator 480A and a second stator 480B received in the stator housing 480SH. The second stator 480B is received adjacent to the first stator 480A in the stator housing 480SH. First and second stators 380A, 380B may each include a plurality of wound stator (like stator elements 340E) arranged in a circular orientation, the same as is shown in cross-section in FIG. 3D.

Each rotor assembly 467A, 467B includes a rotor housing 481A, 481B, which may be substantially identical to one another. Each rotor assembly 467A, 467B includes a drive shaft 438A, 438B which may be received, one inside the other, in close proximity. The drive shafts 438A, 438B may include steps along their length. The respective lengths of the shafts 438A, 438B may be selected based on the robot configuration the motor module 478 will couple to and the number of other modules that are provided in the multi-axis motor drive assembly. Each rotor assembly 467A, 467B includes a bearing assembly 470A, 470B supporting the respective drive shafts 438A, 438B relative to the respective rotor housings 481A, 481B. Any suitable bearing assembly may be used, such as a ball bearing assembly. Inner and outer races of the bearing assemblies 470A, 470B may lie at common diameters, thus allowing the use of common rotor and stator components within the module 478, and in other modules. Each rotor assembly 467A, 467B includes a rotor 482A, 482B also coupled to the respective drive shafts 438A, 438B. Rotors 482A, 482B may include a plurality of arranged magnets (e.g., bar magnets) that may be arranged around the outer periphery of a rotor support 483A, 483B, which is coupled to the respective drive shafts 438A, 438B.

The motor module 478 also includes a vacuum barrier member 472 positioned between the respective rotor 482A, 482B and the respective stator 480A, 480B. In the depicted embodiment, the vacuum barrier member 472 is an annular sleeve that extends between the rotor housing 481A of the first rotor assembly 467A and a second rotor housing 481B of the second rotor assembly 467B, and seals against the respective rotor housings 481A, 481B. Sealing may take place at respective ends of the annular sleeve. Sealing may be provided by any suitable seals (e.g., elastomer O-rings) provided in grooves formed in extending annular portions of the respective rotor housings 481A, 481B. Other suitable vacuum tight seals with the vacuum barrier member 472 may be used.

Each rotor assembly 467A, 467B may include a first encoder element 468A, 468B coupled to the rotor housing 381A, 381B, and a second encoder element 469A, 469B coupled to the drive shaft 438A, 438B.

The motor module 478 may include suitable registration features facilitating axial and/or rotational alignment with other motor modules, like the module 327 described in FIGS. 3A-3D. Registration features may include features like upper axial registration feature 376 and/or a rotational alignment feature 377 (e.g., a pin) as shown in FIGS. 3A-3D. These registration features allow the motor module 478 to be stacked above and/or below another motor module, such that a multi-axis motor drive assembly (e.g., a 2-axis, 3-axis, 4-axis, 5-axis, 6-axis motor assembly, or more) may be assembled.

Figure 5A:
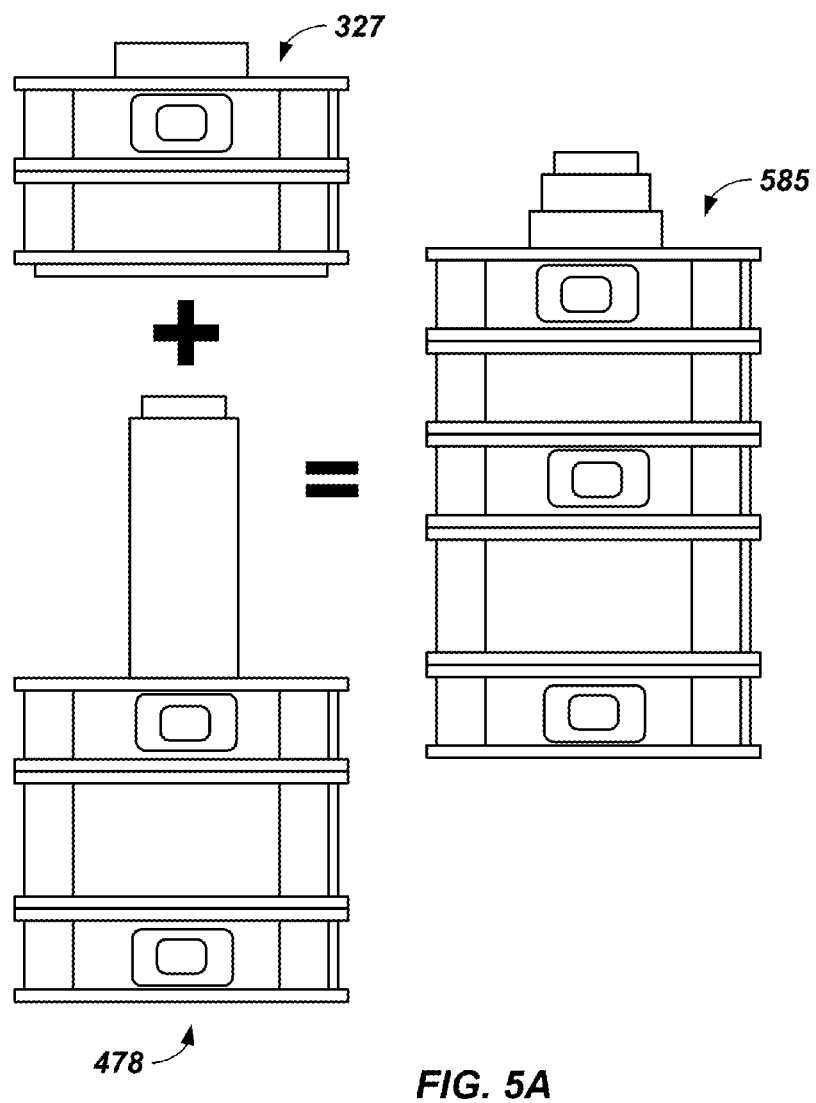
FIG. 5A illustrates an assembly operation forming a multi-axis motor drive assembly from a first motor module and a second motor module according to embodiments.
Figure 5B:
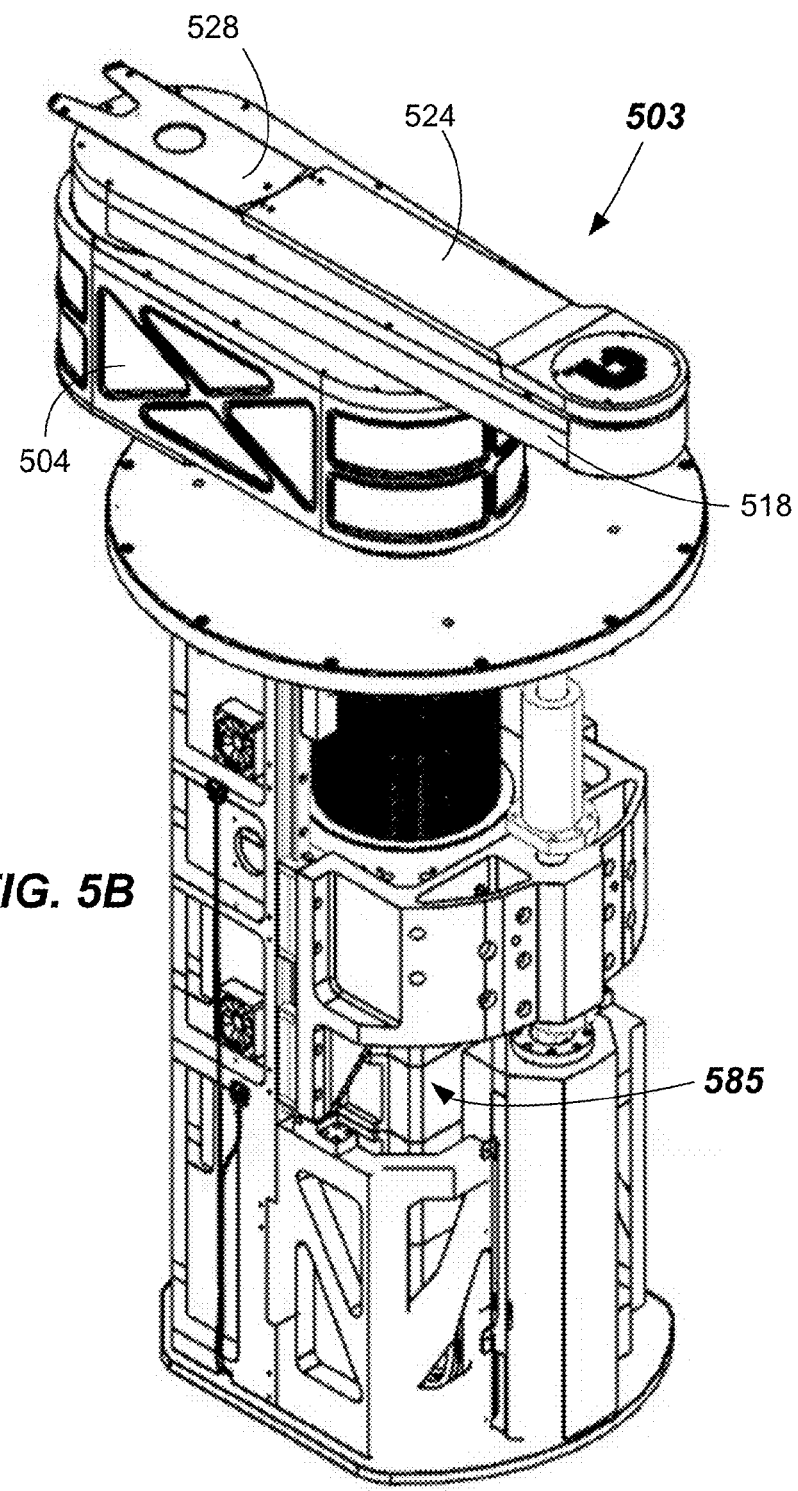
FIG. 5B illustrates a perspective view of a multi-axis robot apparatus including a multi-axis motor drive assembly according to embodiments.

FIGS. 5A and 5B illustrate a multi-axis motor drive assembly 585. This particular embodiment is a multi-axis motor drive assembly 585 made up of a first motor module 327 and a second motor module 478, which are assembled to produce a three-axis motor. Each axis of the three-axis motor may be coupled to a respective robot arm of a robot apparatus, and used to drive the various arm motions. In the depicted embodiment, the first motor module 327 consists of one-axis capability, and the second motor module 467 consists of 2-axis capability.

However, it should be understood that various combinations of the first motor module 327, the second motor module 478, or both, may be assembled to produce a 2-axis, 3-axis motor, 4-axis motor, or 5-axis motor, 6-axis motor, or more. FIG. 5A illustrates assembly of the first motor module 327 consisting of one-axis capability with the second motor module 478 consisting of 2-axis capability to produce the multi-axis motor drive assembly 585 having three-axis capability.

Multi-axis motor drive assembly 585 may be included in a multi-axis robot apparatus 503, such as shown in FIG. 5B. Multi-axis robot apparatus 503 may include a first arm 504 which may be coupled to one axis of the multi-axis motor drive assembly 585 and driven thereby. A forearm 518 may be coupled to another axis of the multi-axis motor drive assembly 585 and driven thereby. A wrist member 524 may be coupled to a third axis of the multi-axis motor drive assembly 585 and driven thereby. Thus, each of the arms of the multi-axis robot apparatus 503 may be driven by the multi-axis motor drive assembly 585 which is made up of a combination of motor modules and used to position end effector 528. The multi-axis motor drive assembly 585 may include Z-axis capability in a manner as previously described.

Figure 6A:
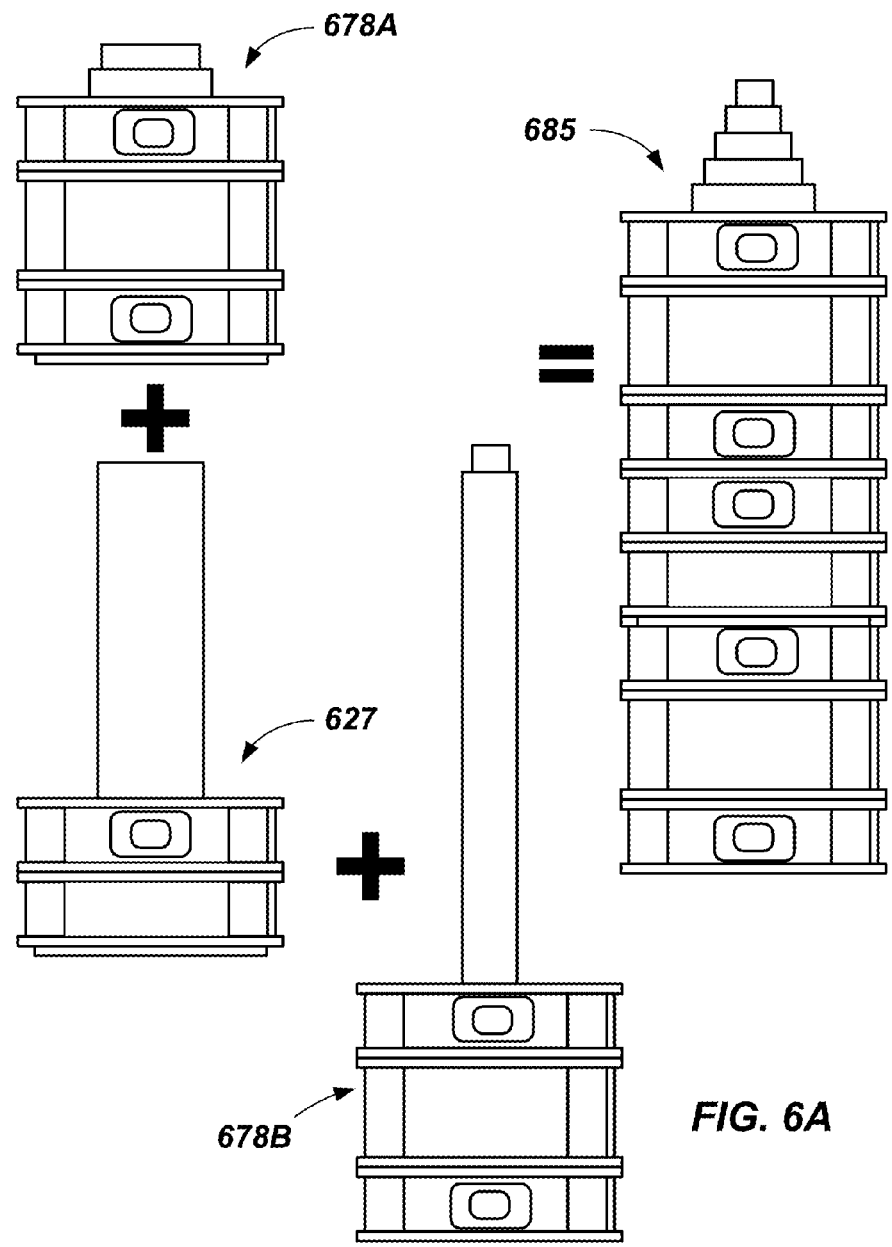
FIG. 6A illustrates an assembly operation forming a multi-axis motor drive assembly from a first motor module, a second motor module, and a third motor module according to embodiments.

FIGS. 6A through 6C illustrate another multi-axis motor drive assembly 685. This particular embodiment is a multi-axis motor drive assembly 685 made up of a first motor module 627, a second motor module 678A, and a third motor module 678B, which are assembled to produce a 5-axis motor. Each axis of the 5-axis motor may be coupled to a robot arm of a robot, and used to drive the various arm motions thereof. In the depicted embodiment, the first motor module 627 consists of one-axis capability, the second motor module 678A consists of 2-axis capability, and the motor module 678A consists of 2-axis capability.

In each of the above examples, the motor modules include common components, except for the drive shafts thereof. The various drive shaft lengths may be selected based upon the number and type of modules assembled, and the general configuration of the robot apparatus that the particular embodiment of multi-axis motor drive assembly is to be coupled to. The following Table 1 below outlines possible motor configurations for various robots, including multi-axis robots and motor module combinations.

TABLE 1

Example Motors

| # Axes in Motor | # of One-Axis Modules | # of Two-Axis Modules |
|---|---|---|
| 1-axis | 1 | 0 |
| 2-axis | 0 | 1 |
| 3-axis | 1 | 1 |
| 4-axis | 0 | 2 |
| 5-axis | 1 | 2 |
| 6-axis | 0 | 3 |

Figure 7:
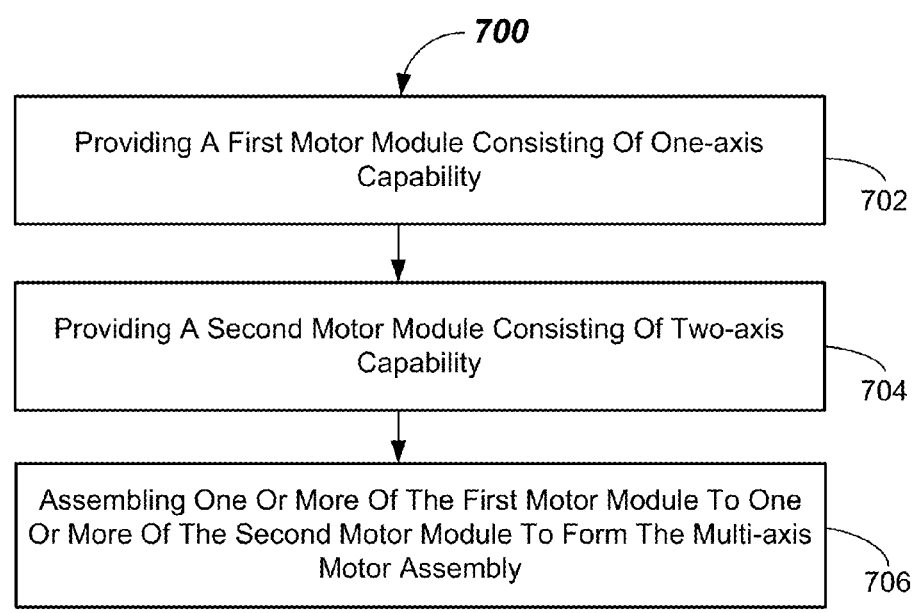
FIG. 7 is a flowchart depicting a method of assembling a multi-axis drive assembly according to embodiments.

A method 700 of assembling a multi-axis motor drive assembly according to embodiments of the present invention is described in FIG. 7. The method 700 includes, in 702, providing a first motor module (e.g., motor module 137, 327, 627) consisting of one-axis capability, and, in 704, providing a second motor module (e.g., second motor module 478, 678A, 678B) consisting of two-axis capability. The method 700 further includes, in 706, assembling one or more of the first motor module to one or more of the second motor module to form the multi-axis motor assembly (e.g., multi-axis motor assembly 111, 211, 585, 685). As shown in Table 1 above, and as described in the 3-axis and 5-axis motor examples provided, 3-axis, 4-axis, 5-axis, 6-axis, or even more axis motors may be readily assembled using the motor modules described herein.

The foregoing description discloses only example embodiments of the invention. Modifications of the above-disclosed assemblies, apparatus, systems and methods which fall within the scope of the invention will be readily apparent to those of ordinary skill in the art. Accordingly, while the present invention has been disclosed in connection with example embodiments, it should be understood that other embodiments may fall within the scope of the invention, as defined by the following claims.

The invention claimed is:

1. A motor module, comprising:
a stator assembly including a stator housing and a stator secured to the stator housing, the stator housing including a stator housing axial end;
a rotor assembly abutting the stator assembly along an axial axis and wherein a portion of the rotor assembly is received inside of the stator assembly, the rotor assembly including:
a rotor housing including a rotor housing axial end, wherein the rotor housing axial end abuts the stator housing axial end along the axial axis,
a drive shaft,
a bearing assembly supporting the drive shaft relative to the rotor housing, and
a rotor coupled to the drive shaft;
a vacuum barrier member positioned between the rotor and the stator; and
at least one registration feature comprising an annular lip located on a lower surface of the stator housing, the at least one registration feature configured to allow the motor module to be stacked in axial and rotational alignment above or below another motor module.

2. The motor module of claim 1, comprising a first encoder element coupled to the rotor housing.

3. The motor module of claim 1, comprising a second encoder element coupled to the drive shaft.

4. The motor module of claim 1, wherein the vacuum barrier member comprises an annular sleeve.

5. The motor module of claim 4, wherein the annular sleeve seals against the stator housing and the rotor housing at ends of the annular sleeve.

6. The motor module of claim 4, wherein the annular sleeve extends between the stator housing and the rotor housing.

7. The motor module of claim 1, wherein the stator assembly comprises:
a first stator and a second stator, and
the second stator is received adjacent to the first stator in the stator housing.

8. The motor module of claim 1, wherein the rotor assembly comprises a first rotor assembly coupled to the stator assembly on a first side, and a second rotor assembly coupled to the stator assembly on a second side.

9. The motor module of claim 8, wherein the annular sleeve extends between the rotor housing of the first rotor assembly, and a second rotor housing of the second rotor assembly.

10. The motor module of claim 1, wherein the rotor assembly comprises a rotor support coupled to the rotor.

11. A multi-axis motor drive assembly, comprising:
a first motor module including a stator assembly including a first stator housing having a first stator axial end and a first stator secured to the first stator housing, and a rotor assembly abutting the stator assembly including a first rotor housing including a first rotor housing axial end, a first drive shaft, a first bearing assembly supporting the drive shaft relative to the first rotor housing, a first rotor coupled to the first drive shaft and rotatable about an axial axis, and a vacuum barrier member positioned between the rotor and the stator, wherein the first rotor housing axial end abuts the first stator housing axial end along the axial axis; and
a second motor module having at least one registration feature comprising an annular lip configured to allow the second motor module to be stacked in axial and rotational alignment above or below the first motor module or another of the second motor module,
wherein combinations of the first motor module, the second motor module, or both, are assembled to produce a two-axis, three-axis motor, four-axis motor, five-axis motor, or six-axis motor.

12. The multi-axis motor drive assembly of claim 11, wherein the first motor module consists of one-axis capability; and a second motor module consists of two-axis capability.

13. The multi-axis motor drive assembly of claim 11, wherein the first motor module consists of one-axis capability; and a second motor module consists of two-axis capability, and the multi-axis drive assembly consists of a three-axis motor.

14. The multi-axis motor drive assembly of claim 11, wherein the first motor module consists of one-axis capability, the second motor module consists of two-axis capability, a third motor module consists of two-axis capability, and the multi-axis drive assembly consists of a five-axis motor.

15. The multi-axis motor drive assembly of claim 11, wherein the second motor module comprises:
a second stator assembly including a second stator housing having a second stator housing axial end and a second stator secured to the second stator housing;
a second rotor assembly abutting the second stator assembly and including:
a second rotor housing including a second rotor housing axial end,
a second drive shaft,
a second bearing assembly supporting the second drive shaft relative to the second rotor housing, and
a second rotor coupled to the second drive shaft; and
a vacuum barrier member positioned between the second rotor and the second stator, wherein the second rotor housing axial end abuts the second stator housing axial end along the axial axis.

16. The multi-axis motor drive assembly of claim 11, wherein the second motor module includes a rotor assembly, the rotor assembly comprising:
a first rotor assembly coupled to a stator assembly on a first side, and
a second rotor assembly coupled to the stator assembly on a second side opposite the first side.

17. The multi-axis motor drive assembly of claim 11, wherein the second motor module includes a stator assembly, comprising:
a first stator; and
a second stator,
wherein the second stator is received adjacent to the first stator in a stator housing.

18. A multi-axis robot apparatus, comprising:
one or more robot arms;
a first motor module having one-axis capability coupled to the one or more first robot arms of the one or more robot arms, the first motor module including an axial axis, a first stator housing including a first stator axial end, and a first rotor housing including a first rotor axial end, wherein the first stator housing axial end abuts the first rotor housing axial end along the axial axis; and
a second motor module having two-axis capability coupled to and adapted to move one or more second robot arms of the one or more robot arms, wherein:
the first motor module has at least one registration feature comprising an annular lip located on a lower surface of the first stator housing configured to allow the first motor module to be stacked in axial and rotational alignment above or below the second motor module.

19. An electronic device processing system, comprising:

a transfer chamber;

a robot apparatus including robot arms received in the transfer chamber and one or more motor modules coupled to the robot arms, at least one motor module including:
- a stator assembly including a stator housing and a stator secured to the stator housing, the stator housing including a stator housing axial end;
- a rotor assembly abutting the stator assembly and including:
  - a rotor housing including a rotor housing axial end, wherein the stator housing axial end abuts the rotor housing axial end,
  - a drive shaft,
  - a bearing assembly supporting the drive shaft relative to the rotor housing, and
  - a rotor coupled to the drive shaft;
- a vacuum barrier member positioned between the rotor and the stator; and
- at least one registration feature comprising an annular lip located on a lower surface of the stator housing, the at least one registration feature configured to allow the at least one motor module to be stacked in axial and rotational alignment above or below another of the one or more motor modules.

20. A method of assembling a multi-axis drive assembly, comprising:

providing a first motor module consisting of one-axis capability and including a stator housing and a stator secured to the stator housing, the stator housing including a stator housing axial end, and a rotor housing including a rotor housing axial end, wherein the stator housing axial end abuts the rotor housing axial end, and a first registration feature comprising an annular lip located on a lower surface of the stator housing is configured to allow the first motor module to be stacked in axial and rotational alignment;

providing a second motor module consisting of two-axis capability and having a second registration feature configured to allow the second motor module to be stacked in axial and rotational alignment; and assembling one or more of the first motor module to one or more of the second motor module via the first registration feature and the second registration feature to form the multi-axis motor assembly.

\* \* \* \* \*